(12) United States Patent
Noguchi et al.

(10) Patent No.: US 12,527,016 B2
(45) Date of Patent: Jan. 13, 2026

(54) SEMICONDUCTOR DEVICE AND MANUFACTURING METHOD

(71) Applicant: FUJI ELECTRIC CO., LTD., Kawasaki (JP)

(72) Inventors: Seiji Noguchi, Matsumoto (JP); Ryutaro Hamasaki, Matsumoto (JP); Daisuke Ozaki, Okaya (JP); Yosuke Sakurai, Azumino (JP); Takuya Yamada, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 452 days.

(21) Appl. No.: 18/304,378

(22) Filed: Apr. 21, 2023

(65) Prior Publication Data

US 2023/0261097 A1   Aug. 17, 2023

Related U.S. Application Data

(63) Continuation of application No. PCT/JP2022/020666, filed on May 18, 2022.

(30) Foreign Application Priority Data

May 19, 2021   (JP) .................................. 2021-084552

(51) Int. Cl.
*H10D 12/00*   (2025.01)
*H10D 30/01*   (2025.01)
(Continued)

(52) U.S. Cl.
CPC ....... *H10D 12/481* (2025.01); *H10D 30/0295* (2025.01); *H10D 62/126* (2025.01);
(Continued)

(58) Field of Classification Search
CPC ............ H10D 12/481; H10D 30/0295; H10D 12/038; H10D 62/126; H10D 64/519;
(Continued)

(56) References Cited

U.S. PATENT DOCUMENTS

2008/0150018 A1   6/2008   Tanabe
2010/0013010 A1   1/2010   Akiyama
(Continued)

FOREIGN PATENT DOCUMENTS

JP   2008160039 A   7/2008
JP   2009135414 A   6/2009
(Continued)

OTHER PUBLICATIONS

International Search Report and (ISA/237) Written Opinion of the International Search Authority for International Patent Application No. PCT/JP2022/020666, mailed by the Japan Patent Office on Aug. 9, 2022.

*Primary Examiner* — Syed I Gheyas

(57) ABSTRACT

Provided is a semiconductor device including: a first trench contact portion provided to an inside of a contact region; a second trench contact portion provided to an inside of an emitter region; a first plug portion of a second conductivity type, which is provided in contact with a lower end of the first trench contact portion and has a higher concentration than a base region; and a second plug portion of a second conductivity type, which is provided in contact with a lower end of the second trench contact portion, is provided to a position closer to a lower surface than the first plug portion, and has a higher concentration than the base region.

20 Claims, 17 Drawing Sheets

(51) Int. Cl.
*H10D 62/10* (2025.01)
*H10D 62/13* (2025.01)
*H10D 64/23* (2025.01)

(52) U.S. Cl.
CPC ......... *H10D 62/133* (2025.01); *H10D 62/137* (2025.01); *H10D 64/231* (2025.01)

(58) Field of Classification Search
CPC .... H10D 62/106; H10D 62/109; H10D 64/62; H10D 84/811
See application file for complete search history.

(56) References Cited

U.S. PATENT DOCUMENTS

| | | | |
|---|---|---|---|
| 2012/0214281 A1 | 8/2012 | Tomita | |
| 2013/0069146 A1 | 3/2013 | Okumura | |
| 2014/0231828 A1 | 8/2014 | Horikawa | |
| 2015/0340480 A1* | 11/2015 | Matsuura | H10D 64/231 257/144 |
| 2015/0372090 A1 | 12/2015 | Osawa | |
| 2016/0190123 A1 | 6/2016 | Laven | |
| 2016/0204097 A1 | 7/2016 | Laven | |
| 2018/0337233 A1* | 11/2018 | Naito | H10D 64/231 |
| 2018/0366548 A1 | 12/2018 | Naito | |
| 2018/0366577 A1* | 12/2018 | Toyoda | H10D 84/038 |
| 2018/0374948 A1* | 12/2018 | Naito | H10D 62/393 |
| 2019/0181254 A1* | 6/2019 | Nagata | H10D 64/23 |
| 2020/0098905 A1 | 3/2020 | Naito | |
| 2020/0287005 A1* | 9/2020 | Imagawa | H10D 30/60 |
| 2021/0234027 A1 | 7/2021 | Yoshida | |
| 2022/0216314 A1 | 7/2022 | Harada | |

FOREIGN PATENT DOCUMENTS

| | | |
|---|---|---|
| JP | 2010027719 A | 2/2010 |
| JP | 2010147380 A | 7/2010 |
| JP | 2010147381 A | 7/2010 |
| JP | 2012059873 A | 3/2012 |
| JP | 2012174989 A | 9/2012 |
| JP | 2013065724 A | 4/2013 |
| JP | 2014158013 A | 8/2014 |
| JP | 2014212358 A | 11/2014 |
| JP | 2016012581 A | 1/2016 |
| JP | 2016146470 A | 8/2016 |
| JP | 2016154218 A | 8/2016 |
| JP | 2018195798 A | 12/2018 |
| WO | 2014041808 A1 | 3/2014 |
| WO | 2018052098 A1 | 3/2018 |
| WO | 2018052099 A1 | 3/2018 |
| WO | 2019117248 A1 | 6/2019 |
| WO | 2019244485 A1 | 12/2019 |
| WO | 2020213254 A1 | 10/2020 |
| WO | 2021210293 A1 | 10/2021 |

* cited by examiner

SEMICONDUCTOR DEVICE AND MANUFACTURING METHOD

The contents of the following Japanese patent application(s) are incorporated herein by reference:
NO. 2021-084552 filed in JP on May 19, 2021
NO. PCT/JP2022/020666 filed in WO on May 18, 2022

BACKGROUND

1. Technical Field

The present invention relates to a semiconductor device and a manufacturing method.

2. Related Art

Conventionally, there is known a semiconductor device provided with a contact trench (see, for example, Patent Document 1).
Patent Document 1: WO 2018/052099

DESCRIPTION OF EXEMPLARY EMBODIMENTS

Figure 1:
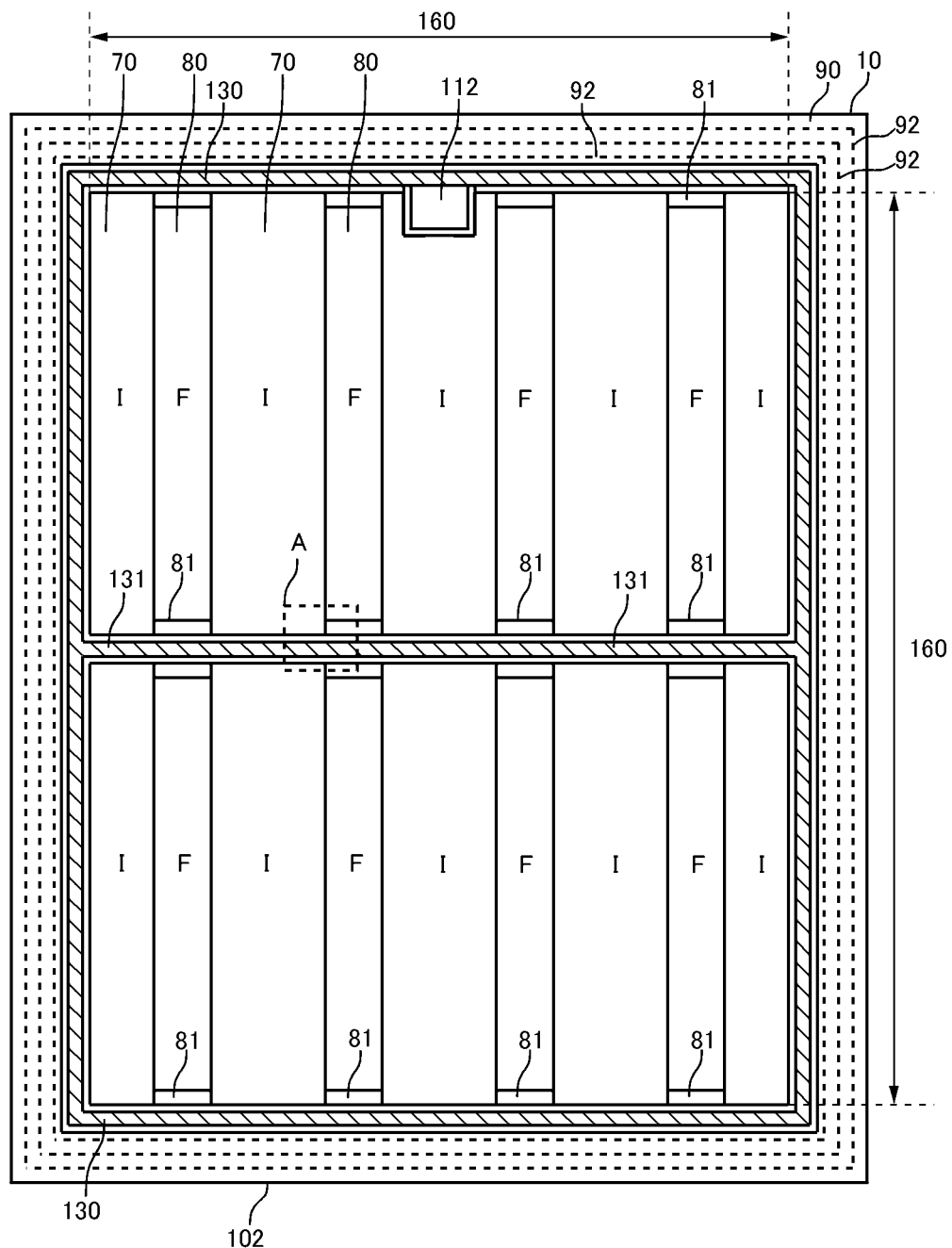
FIG. 1 is an example of a top view of a semiconductor device 100.

Hereinafter, the present invention will be described through embodiments of the invention, but the following embodiments do not limit the invention according to the claims. In addition, not all of the combinations of features described in the embodiments are essential to the solving means of the invention.

Unless otherwise stated, an SI unit system is used as a unit system in the present specification. Although a unit of length may be expressed in cm, calculations may be carried out after conversion to meters (m). In the present specification, one side of a direction parallel to a depth direction of a semiconductor substrate is referred to as "upper", and the other side is referred to as "lower". One of two main surfaces of a substrate, a layer, or other members is referred to as an "upper surface", and the other surface is referred to as a "lower surface". "Upper" and "lower" directions are not limited to a direction of gravity or a direction in which a semiconductor device is mounted.

As used in the present specification, technical matters may be described with orthogonal coordinate axes consisting of an X axis, a Y axis, and a Z axis. The orthogonal coordinate axes are merely for specifying relative positions of components, and thus do not limit a specific direction. For example, the Z axis is not limited to indicate a height direction with respect to the ground. It is to be noted that a +Z axis direction and a −Z axis direction are directions opposite to each other. When a direction is referred to as a "Z axis direction" without these "+" and "−" signs, it means that the Z axis direction is parallel to the +Z axis and the −Z axis.

In the present specification, orthogonal axes parallel to an upper surface and lower surface of a semiconductor substrate are referred to as the X axis and the Y axis. Further, an axis perpendicular to the upper surface and the lower surface of the semiconductor substrate is referred to as the Z axis. As used in the present specification, a direction of the Z axis may be referred to as a depth direction. Further, in the present specification, a direction parallel to the upper surface and the lower surface of the semiconductor substrate may be referred to as a horizontal direction, including the X axis direction and the Y axis direction. When referred to as an upper surface side of the semiconductor substrate in the present specification, the upper surface side indicates a region from the center to the upper surface in the depth direction of the semiconductor substrate. When referred to as a lower surface side of the semiconductor substrate, the lower surface side indicates a region from the center to the lower surface in the depth direction of the semiconductor substrate.

As used in the present specification, phrases such as "same" or "equal" may be used even when there is an error caused due to a variation in a manufacturing step or the like. This error is within 10%, for example.

In the present specification, a conductivity type of a doping region in which an impurity has been doped is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor representing the conductivity type of the N type or a semiconductor representing the conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration and the acceptor concentration set as a negative ion concentration, including polarities of charges. As an example, when the donor concentration is represented by $N_D$ and the acceptor concentration is represented by $N_A$, the net doping concentration at any position is given as $N_D$-$N_A$.

The donor has a function of supplying electrons to a semiconductor. The acceptor has a function of receiving electrons from the semiconductor. The donor and the acceptor are not limited to the impurities themselves. For example, a VOH defect that is a combination of a vacancy (V), oxygen (O), and hydrogen (H) existing in the semiconductor functions as the donor that supplies electrons.

In the present specification, a description of a P+ type or an N+ type means a higher doping concentration than the P type or the N type, and a description of a P− type or an N− type means a lower doping concentration than the P type or the N type. Further, in the present specification, a description of a P++ type or an N++ type means a higher doping concentration than the P+ type or the N+ type.

A chemical concentration in the present specification indicates an atomic density of an impurity measured regardless of an electrical activation state. The chemical concentration (atomic density) can be measured by secondary ion mass spectrometry (SIMS), for example. The net doping concentration described above can be measured by a voltage-capacitance measurement method (CV profiling). In addition, a carrier density measured by a spreading resistance method (SRP method) may be used as the net doping concentration. It may be assumed that the carrier density measured by the CV profiling or the SRP method is a value in a thermal equilibrium state. In addition, because, in an N type region, the donor concentration is sufficiently larger than the acceptor concentration, the carrier density in the region may be used as the donor concentration. Similarly, the carrier density in a P type region may be used as the acceptor concentration in the region.

Further, when a concentration distribution of the donor, acceptor, or net doping has a peak in a region, a value of the peak may be set as the concentration of the donor, acceptor, or net doping in the region. When the concentration of the donor, acceptor, or net doping is substantially uniform, or the like, an average value of the concentration of the donor, acceptor, or net doping in the region may be set as the concentration of the donor, acceptor, or net doping.

The carrier density measured by the SRP method may be lower than the concentration of a donor or an acceptor. In a range where a current flows at a time of measuring a spreading resistance, carrier mobility of the semiconductor substrate may be lower than a value in a crystalline state. The reduction in the carrier mobility occurs when carriers are scattered due to disorder of a crystal structure due to a lattice defect or the like.

The concentration of a donor or an acceptor calculated from a carrier density measured by the CV profiling or the SRP method may be lower than a chemical concentration of an element indicating the donor or the acceptor. As an example, in a silicon semiconductor, a donor concentration of phosphorus or arsenic serving as a donor, or an acceptor concentration of boron serving as an acceptor is approximately 99% of their chemical concentrations. On the other hand, in the silicon semiconductor, a donor concentration of hydrogen serving as a donor is approximately 0.1% to 10% of a chemical concentration of hydrogen.

FIG. 1 is a top view showing an example of a semiconductor device 100. FIG. 1 shows a position at which each member is projected on an upper surface of a semiconductor substrate 10. FIG. 1 shows merely some members of the semiconductor device 100, and omits illustrations of some members.

The semiconductor device 100 includes the semiconductor substrate 10. The semiconductor substrate 10 is a substrate that is formed of a semiconductor material. Although the semiconductor substrate 10 is a silicon substrate as an example, the material of the semiconductor substrate 10 is not limited to silicon.

The semiconductor substrate 10 has end sides 102 in a top view. When merely referred to as the top view in the present specification, it means that the semiconductor substrate 10 is viewed from an upper surface side. The semiconductor substrate 10 of the present example includes two sets of end sides 102 facing each other in the top view. In FIG. 1, the X axis and the Y axis are parallel to any of the end sides 102. In addition, the Z axis is perpendicular to the upper surface of the semiconductor substrate 10.

The semiconductor substrate 10 is provided with an active portion 160. The active portion 160 is a region where a main current flows in the depth direction between the upper surface and the lower surface of the semiconductor substrate 10 when the semiconductor device 100 operates. An emitter electrode is provided above the active portion 160, but is omitted in FIG. 1.

The active portion 160 is provided with at least one of a transistor portion 70 including a transistor device such as an IGBT (Insulated Gate Bipolar Transistor) or a diode portion 80 including a diode device such as an FWD (Free Wheeling Diode). In the example of FIG. 1, the transistor portion 70 and the diode portion 80 are alternately arranged along a predetermined array direction (the X axis direction in the present example) on the upper surface of the semiconductor substrate 10. In another example, the active portion 160 may be provided with only one of the transistor portion 70 or the diode portion 80.

In FIG. 1, a region where each of the transistor portions 70 is arranged is indicated by a symbol "I", and a region where each of the diode portions 80 is arranged is indicated by a symbol "F". In the present specification, a direction perpendicular to the array direction in the top view may be referred to as an extending direction (the Y axis direction in FIG. 1). Each of the transistor portions 70 and the diode portions 80 may have a longitudinal length in the extending direction. In other words, the length of each of the transistor portions 70 in the Y axis direction is larger than the width thereof in the X axis direction. Similarly, the length of each of the diode portions 80 in the Y axis direction is larger than the width thereof in the X axis direction. The extending direction of the transistor portion 70 and the diode portion 80 and the longitudinal direction of each trench portion to be described later may be the same.

Each of the diode portions 80 includes a cathode region of an N+ type in a region in contact with the lower surface of the semiconductor substrate 10. In the present specification, a region where the cathode region is provided is referred to as the diode portion 80. In other words, the diode portion 80 is a region that overlaps with the cathode region in the top view. On the lower surface of the semiconductor substrate 10, a collector region of a P+ type may be provided in a region other than the cathode region. In the present specification, the diode portion 80 may also include an extension region 81 where the diode portion 80 extends to a gate runner to be described later in the Y axis direction. The collector region is provided on a lower surface of the extension region 81.

The transistor portion 70 includes the collector region of the P+ type in a region in contact with the lower surface of the semiconductor substrate 10. In addition, in the transistor portion 70, there is periodically arranged a gate structure which includes an N type emitter region, a P type base region, a gate conductive portion, and a gate dielectric film, on the upper surface side of the semiconductor substrate 10.

The semiconductor device 100 may include one or more pads above the semiconductor substrate 10. The semiconductor device 100 of the present example includes a gate pad 112. The semiconductor device 100 may also include pads such as an anode pad, a cathode pad, and a current detection pad. Each pad is arranged in the vicinity of the end side 102. The vicinity of the end side 102 refers to a region between the end side 102 and the emitter electrode in the top view. When the semiconductor device 100 is mounted, each pad may be connected to an external circuit via a wiring such as a wire.

A gate potential is applied to the gate pad 112. The gate pad 112 is electrically connected to a conductive portion of a gate trench portion of the active portion 160. The semiconductor device 100 includes a gate runner that connects the gate pad 112 and the gate trench portion. In FIG. 1, the gate runner is hatched with diagonal lines.

The gate runner of the present example includes an outer circumferential gate runner 130 and an active-side gate runner 131. The outer circumferential gate runner 130 is arranged between the active portion 160 and the end side 102 of the semiconductor substrate 10 in the top view. The outer circumferential gate runner 130 of the present example encloses the active portion 160 in the top view. A region enclosed by the outer circumferential gate runner 130 in the top view may be the active portion 160. Further, the outer circumferential gate runner 130 is connected to the gate pad 112. The outer circumferential gate runner 130 is arranged above the semiconductor substrate 10. The outer circumferential gate runner 130 may be a metal wiring containing aluminum or the like.

The active-side gate runner 131 is provided in the active portion 160. By providing the active-side gate runner 131 in the active portion 160, it is possible to reduce a variation in wiring length from the gate pad 112 in each region of the semiconductor substrate 10.

The active-side gate runner 131 is connected to the gate trench portion of the active portion 160. The active-side gate runner 131 is arranged above the semiconductor substrate 10. The active-side gate runner 131 may be a wiring formed of a semiconductor such as polysilicon doped with an impurity.

The active-side gate runner 131 may be connected to the outer circumferential gate runner 130. The active-side gate runner 131 of the present example is provided to extend in the X axis direction so as to cross the active portion 160 from one outer circumferential gate runner 130 to the other outer circumferential gate runner 130. The active-side gate runner 131 may be provided at substantially the center of the active portion 160 in the Y axis direction. When the active portion 160 is divided by the active-side gate runner 131, the transistor portion 70 and the diode portion 80 may be alternately arranged in the X axis direction in each of the divided regions.

In addition, the semiconductor device 100 may include a temperature sensing portion (not shown) which is a PN junction diode formed of polysilicon or the like, and a current detection portion (not shown) which simulates an operation of the transistor portion provided in the active portion 160.

The semiconductor device 100 of the present example includes an edge termination structure portion 90 between the active portion 160 and the end side 102 in the top view. The edge termination structure portion 90 of the present example is arranged between the outer circumferential gate runner 130 and the end sides 102. The edge termination structure portion 90 relaxes an electric field strength on the upper surface side of the semiconductor substrate 10. The edge termination structure portion 90 may include at least one of a guard ring 92, a field plate, or a RESURF which is annularly provided to enclose the active portion 160.

Figure 2:
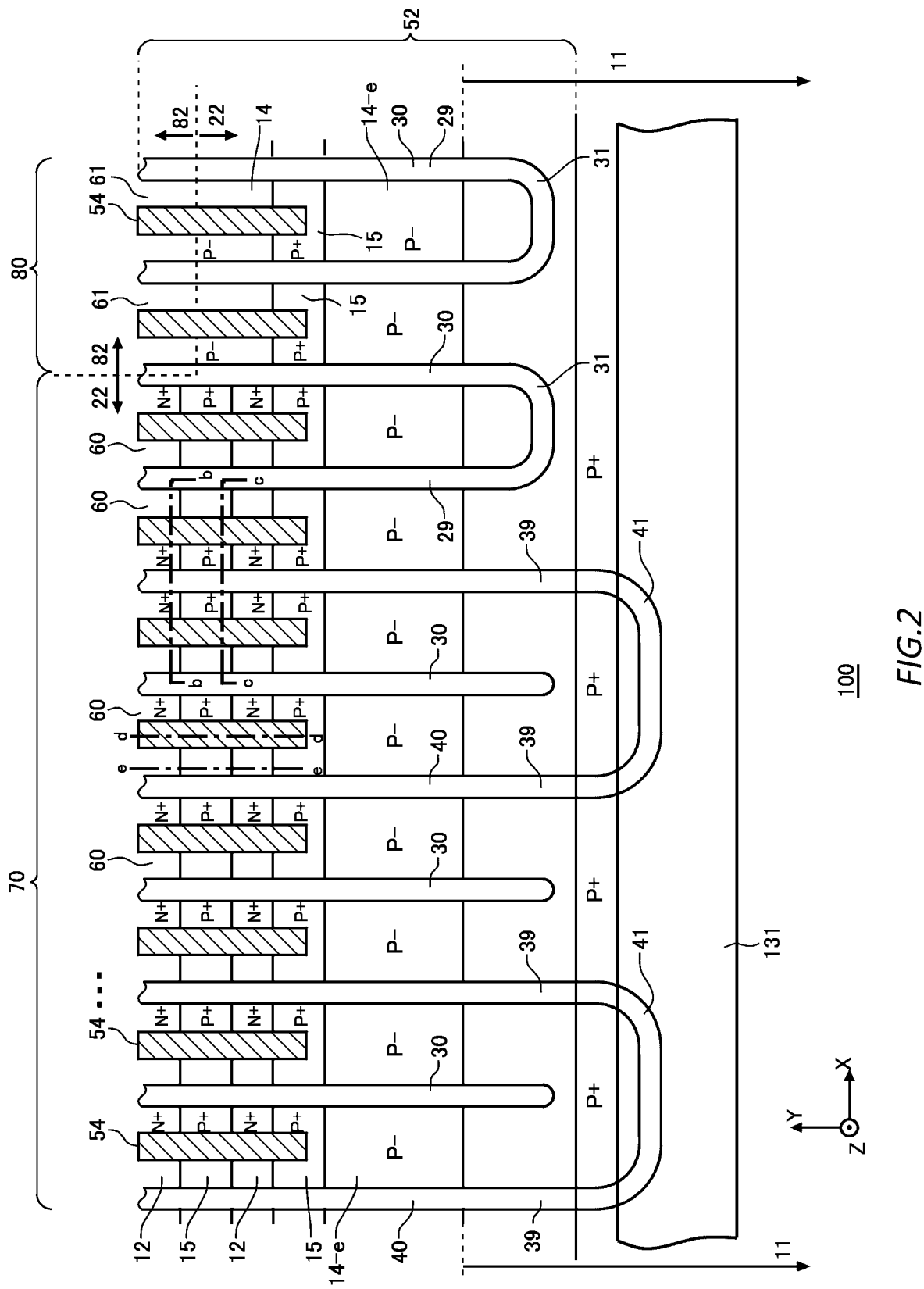
FIG. 2 is an enlarged diagram of a region A in FIG. 1.

FIG. 2 is an enlarged diagram of a region A in FIG. 1. The region A is a region including the transistor portion 70, the diode portion 80, and the active-side gate runner 131. The semiconductor device 100 of the present example includes a gate trench portion 40, a dummy trench portion 30, a well region 11, an emitter region 12, a base region 14, and a contact region 15, which are provided inside the semiconductor substrate 10 on the upper surface side. The gate trench portion 40 and the dummy trench portion 30 are each an example of a trench portion. In addition, the semiconductor device 100 of the present example includes an emitter electrode 52 and the active-side gate runner 131 which are provided above the upper surface of the semiconductor substrate 10. The emitter electrode 52 and the active-side gate runner 131 are provided separate from each other.

Between the emitter electrode 52 and the active-side gate runner 131, and the upper surface of the semiconductor substrate 10, an interlayer dielectric film is provided, but an illustration thereof is omitted in FIG. 2. In the interlayer dielectric film of the present example, a trench contact portion 54 is provided so as to penetrate through the interlayer dielectric film. The trench contact portion 54 of the present example reaches the inside of the semiconductor substrate 10. A conductive material is filled inside the trench contact portion 54. In the present specification, the conductive material inside the trench contact portion 54 may be described as a part of the emitter electrode 52. The emitter electrode 52 is connected to the semiconductor substrate 10 via the trench contact portion 54. The same material as the emitter electrode 52 provided on the interlayer dielectric film may be filled inside the trench contact portion 54, or a different material from the emitter electrode 52 may be filled therein. In FIG. 2, each of the trench contact portions 54 is hatched with diagonal lines.

The emitter electrode 52 is provided above the gate trench portion 40, the dummy trench portion 30, the well region 11, the emitter region 12, the base region 14, and the contact region 15. The emitter electrode 52 electrically connects the emitter region 12, the contact region 15, and the base region 14 on the upper surface of the semiconductor substrate 10 via the trench contact portion 54. Further, the emitter electrode 52 is connected to a dummy conductive portion in the dummy trench portion 30 through a contact hole provided in the interlayer dielectric film. The emitter electrode 52 may be connected to the dummy conductive portion of the dummy trench portion 30 at an edge of the dummy trench portion 30 in the Y axis direction.

The active-side gate runner 131 is connected to the gate trench portion 40 through the contact hole provided in the interlayer dielectric film. The active-side gate runner 131 may be connected to a gate conductive portion of the gate trench portion 40 in an edge portion 41 of the gate trench portion 40 in the Y axis direction. The active-side gate runner 131 is not connected to the dummy conductive portion in the dummy trench portion 30.

The emitter electrode 52 is formed of a material including metal. FIG. 2 shows a range where the emitter electrode 52 is provided. For example, at least a partial region of the emitter electrode 52 is formed of a metal alloy such as AlSi and AlSiCu. The emitter electrode 52 may have a barrier metal formed of titanium, a titanium compound, or the like below a region formed of a material including aluminum (Al), or the like. The emitter electrode 52 may contain tungsten filled into a trench contact portion 54. Inside the trench contact portion 54, the barrier metal and tungsten may be stacked in order from a side closer to the semiconductor substrate 10. The emitter electrode 52 on tungsten and the interlayer dielectric film may be formed of a material including aluminum.

The well region 11 is provided so as to overlap with the active-side gate runner 131. The well region 11 is provided so as to extend with a predetermined width also in a range not overlapping with the active-side gate runner 131. The well region 11 of the present example is provided apart from an end of the trench contact portion 54 in the Y axis direction, on the active-side gate runner 131 side. The well region 11 is a region of the second conductivity type, which has a higher doping concentration than the base region 14. The base region 14 of the present example is of the P− type, and the well region 11 is of the P+ type.

Each of the transistor portion 70 and the diode portion 80 includes a plurality of trench portions arrayed in the array direction. In the transistor portion 70 of the present example, one or more gate trench portions 40 and one or more dummy trench portions 30 are alternately provided along the array direction. In the diode portion 80 of the present example, the plurality of dummy trench portions 30 are provided along the array direction. In the diode portion 80 of the present example, the gate trench portion 40 is not provided.

The gate trench portion 40 of the present example may have two linear portions 39 extending along the extending direction perpendicular to the array direction (portions of a trench that are linear along the extending direction), and the edge portion 41 connecting the two linear portions 39. The extending direction in FIG. 2 is the Y axis direction. The longitudinal direction of the gate trench portion 40 is the same as the extending direction.

At least a part of the edge portion 41 is preferably provided in a curved shape in a top view. By connecting end portions of the two linear portions 39 in the Y axis direction by the edge portion 41, it is possible to relax an electric field strength at the end portions of the linear portions 39.

In the transistor portion 70, the dummy trench portions 30 are provided between the respective linear portions 39 of the gate trench portions 40. Between the respective linear portions 39, one dummy trench portion 30 may be provided, or a plurality of dummy trench portions 30 may be provided. The dummy trench portion 30 may have a linear shape extending in the extending direction, or may have linear portions 29 and an edge portion 31 similar to the gate trench portion 40. The semiconductor device 100 shown in FIG. 2 includes both of the linear dummy trench portion 30 having no edge portion 31, and the dummy trench portion 30 having the edge portion 31.

A diffusion depth of the well region 11 may be deeper than the depth of the gate trench portion 40 and the dummy trench portion 30. The end portions of the gate trench portion 40 and the dummy trench portion 30 in the Y axis direction are provided in the well region 11 in a top view. In other words, a bottom portion of each trench portion in the depth direction is covered by the well region 11 at the end portion of each trench portion in the Y axis direction. With this configuration, the electric field strength at the bottom portion of each trench portion can be relaxed.

A mesa portion is provided between the respective trench portions in the array direction. The mesa portion refers to a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of the present example is provided so as to extend in the extending direction (the Y axis direction) along the trench, on the upper surface of the semiconductor substrate 10. In the present example, a mesa portion 60 is provided in the transistor portion 70, and a mesa portion 61 is provided in the diode portion 80. When simply referred to as the "mesa portion" in the present specification, the portion refers to each of the mesa portion 60 and the mesa portion 61.

Each mesa portion is provided with the base region 14. Of the base regions 14 exposed on the upper surface of the semiconductor substrate 10 in the mesa portion, a region arranged closest to the active-side gate runner 131 is assumed to be a base region 14-e. While FIG. 2 shows the base region 14-e arranged at one end portion of each mesa portion in the extending direction, the base region 14-e is also arranged at the other end portion of each mesa portion. In each mesa portion, at least one of the emitter region 12 of the first conductivity type or the contact region 15 of the second conductivity type may be provided in a region sandwiched between the base regions 14-e in a top view. The emitter region 12 of the present example is of the N+ type, and the contact region 15 is of the P+ type. The emitter region 12 and the contact region 15 may be provided between the base region 14 and the upper surface of the semiconductor substrate 10 in the depth direction.

The mesa portion 60 of the transistor portion 70 includes the emitter region 12 exposed on the upper surface of the semiconductor substrate 10. The emitter region 12 is provided in contact with the gate trench portion 40. The mesa portion 60 in contact with the gate trench portion 40 may be provided with the contact region 15 exposed on the upper surface of the semiconductor substrate 10.

Each of the contact region 15 and the emitter region 12 in the mesa portion 60 is provided from one trench portion to the other trench portion in the X axis direction. As an example, the contact region 15 and the emitter region 12 of the mesa portion 60 are alternately arranged along the extending direction of the trench portion (the Y axis direction).

In another example, the contact region 15 and the emitter region 12 of the mesa portion 60 may be provided in a stripe pattern along the extending direction of the trench portion (the Y axis direction). For example, the emitter region 12 is provided in a region in contact with the trench portion, and the contact region 15 is provided in a region sandwiched between the emitter regions 12.

The emitter region 12 is not provided in the mesa portion 61 of the diode portion 80. The base region 14 and the contact region 15 may be provided on an upper surface of the mesa portion 61. The contact region 15 may be provided in contact with each of the base regions 14-e in a region sandwiched between the base regions 14-e on the upper surface of the mesa portion 61. The base region 14 may be provided in a region sandwiched between the contact regions 15 on the upper surface of the mesa portion 61. The base region 14 may be arranged in an entire region sandwiched between the contact regions 15.

The trench contact portion 54 is provided above each mesa portion. The trench contact portion 54 is arranged in a region sandwiched between the base regions 14-e. The trench contact portion 54 of the present example is provided above the respective regions of the contact region 15, the base region 14, and the emitter region 12. The trench contact portion 54 is not provided in regions corresponding to the base region 14-e and the well region 11. The trench contact portion 54 may be arranged at the center of the mesa portion 60 in the array direction (the X axis direction).

In the diode portion 80, an N+ type cathode region 82 is provided in a region adjacent to the lower surface of the semiconductor substrate 10. On the lower surface of the semiconductor substrate 10, a P+ type collector region 22 may be provided in a region where the cathode region 82 is not provided. The cathode region 82 and the collector region 22 are provided between the lower surface 23 of the semiconductor substrate 10 and a buffer region 20. In FIG. 2, a boundary between the cathode region 82 and the collector region 22 is indicated by a dotted line.

The cathode region 82 is arranged apart from the well region 11 in the Y axis direction. With this configuration, a distance between the P type region (the well region 11) which has a relatively high doping concentration and is formed to a deep position and the cathode region 82 is ensured, so that the breakdown voltage can be improved. The end portion of the cathode region 82 of the present example in the Y axis direction is arranged farther apart from the well region 11 than the end portion of the trench contact portion 54 in the Y axis direction. In another example, the end portion of the cathode region 82 in the Y axis direction may be arranged between the well region 11 and the trench contact portion 54.

Figure 3:
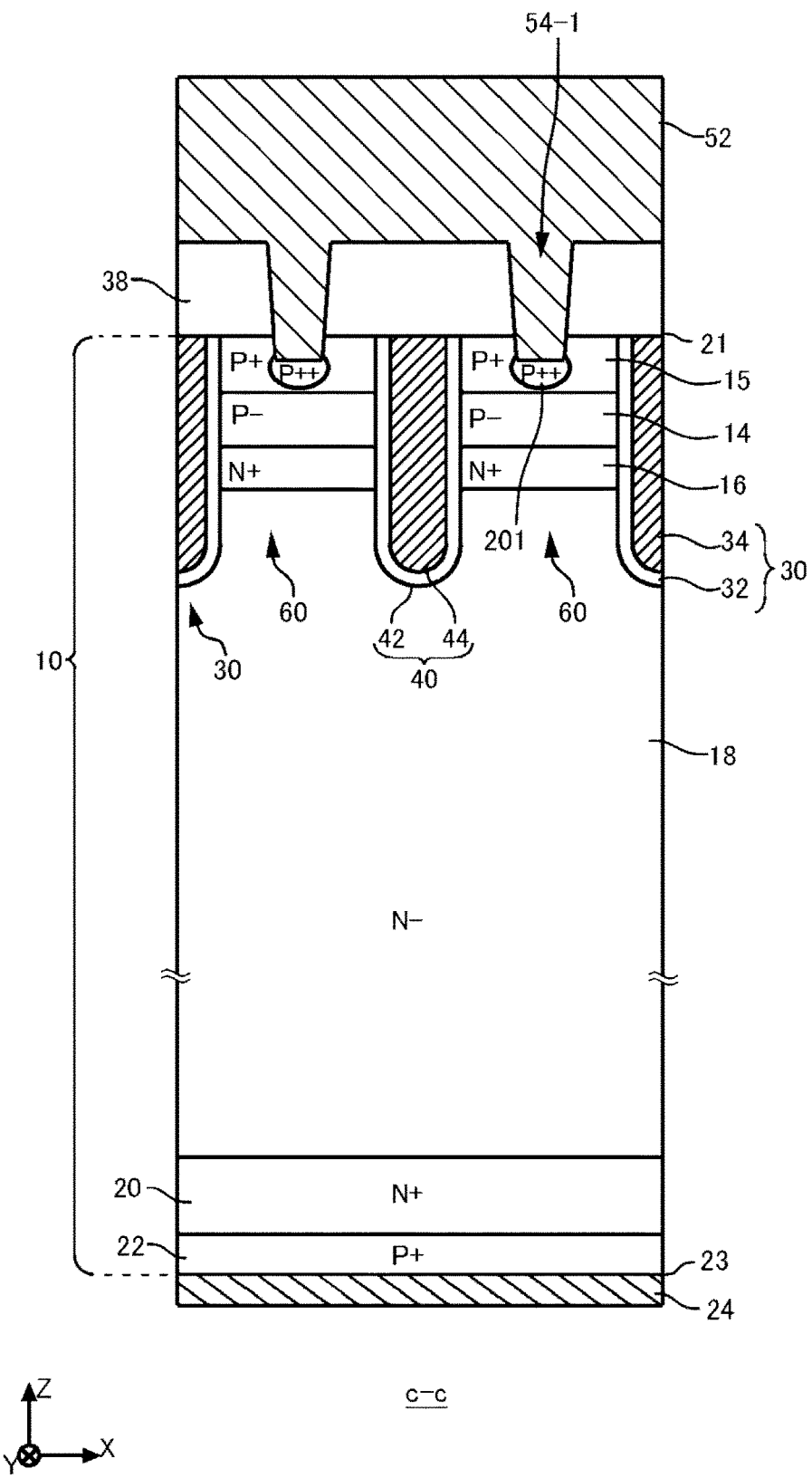
FIG. 3 is a diagram showing an example of a cross section c-c in FIG. 2.

FIG. 3 is a diagram showing an example of a cross section c-c in FIG. 2. The cross section c-c is an X-Z plane that passes through the contact region 15 in the mesa portion 60. As described above, the mesa portion 60 is a region sandwiched between two trench portions arranged adjacent to each other in the X axis direction. The mesa portion 60 in the example shown in FIG. 3 is sandwiched between the gate trench portion 40 and the dummy trench portion 30. The semiconductor device 100 includes the semiconductor substrate 10, an interlayer dielectric film 38, the emitter electrode 52, and a collector electrode 24, in the cross section.

The interlayer dielectric film 38 is provided on the upper surface of the semiconductor substrate 10. The interlayer dielectric film 38 is a film including at least one layer of a dielectric film such as silicate glass added with impurities of boron, phosphorus, or the like, a thermally oxidized film, or other dielectric films. The interlayer dielectric film 38 is provided with the trench contact portions 54 described in FIG. 2.

The emitter electrode 52 is provided above the interlayer dielectric film 38. The emitter electrode 52 is in contact with the upper surface 21 of the semiconductor substrate 10 through the trench contact portions 54 of the interlayer dielectric film 38. The collector electrode 24 is provided on the lower surface 23 of the semiconductor substrate 10. The emitter electrode 52 and the collector electrode 24 are formed of a metal material such as aluminum. In the present specification, a direction in which the emitter electrode 52 is connected to the collector electrode 24 (the Z axis direction) is referred to as the depth direction.

The semiconductor substrate 10 includes an N type or N− type drift region 18. In the mesa portion 60, the P+ type contact region 15 and the P− type base region 14 are provided in order from the upper surface 21 side of the semiconductor substrate 10. The drift region 18 is provided below the base region 14. The mesa portion 60 may be provided with an N+ type accumulation region 16. The accumulation region 16 is arranged between the base region 14 and the drift region 18.

The contact region 15 is exposed on the upper surface 21 of the semiconductor substrate 10 and is in contact with the trench portions on both sides of the mesa portion 60. The doping concentration of the contact region 15 is equal to or larger than the doping concentration of the base region 14. In other words, the doping concentration of the contact region 15 may be the same as the doping concentration of the base region 14. In this case, the base region 14 is exposed on the upper surface 21 as the contact region 15. Further, the doping concentration of the contact region 15 may be higher than the doping concentration of the base region 14. In this case, the P type region having a higher concentration than the base region 14 is exposed on the upper surface 21.

The base region 14 is provided below the contact region 15. The base region 14 of the present example is provided in contact with the contact region 15.

The base region 14 may be in contact with the trench portions on both sides of the mesa portion 60.

The accumulation region 16 is provided below the base region 14. The accumulation region 16 is an N+ type region having a higher doping concentration than the drift region 18. The accumulation region 16 may have a concentration peak of a donor such as a phosphorus or hydrogen donor. By providing the accumulation region 16 having a high concentration between the drift region 18 and the base region 14, it is possible to improve a carrier injection enhancement effect (IE effect) and reduce an on-voltage. The accumulation region 16 may be provided to cover an entire lower surface of the base region 14 in each mesa portion 60.

An N+ type buffer region 20 may be provided below the drift region 18. The doping concentration of the buffer region 20 is higher than the doping concentration of the drift region 18. The buffer region 20 may have a concentration peak having a higher doping concentration than the drift region 18. The doping concentration of the concentration peak refers to a doping concentration at a local maximum of the concentration peak. Further, as the doping concentration of the drift region 18, an average value of doping concentrations in a region where the doping concentration distribution is substantially flat may be used.

The buffer region 20 may be formed by ion implantation of an N type dopant such as hydrogen (proton) or phosphorus. The buffer region 20 of the present example is formed by ion implantation of hydrogen. The buffer region 20 may function as a field stopper layer which prevents a depletion layer expanding from the lower end of the base region 14 from reaching the P+ type collector region 22 and the N+ type cathode region 82.

The P+ type collector region 22 is provided below the buffer region 20. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron.

The collector region 22 is exposed on the lower surface 23 of the semiconductor substrate 10 and is connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion penetrates through the base region 14 from the upper surface 21 of the semiconductor substrate 10, and reaches the drift region 18. In a region where at least any of the emitter region 12, the contact region 15, and the accumulation region 16 is provided, each trench portion also penetrates through these doping regions to reach the drift region 18. The configuration of the trench portion penetrating through the doping region is not limited to the one manufactured in the order of forming the doping region and then forming the trench portion. The configuration of the trench portion penetrating through the doping region also includes a configuration of the doping region being formed between the trench portions after forming the trench portions.

The gate trench portion 40 includes a gate trench, a gate dielectric film 42, and a gate conductive portion 44 provided on the upper surface 21 of the semiconductor substrate 10. The gate dielectric film 42 is provided to cover an inner wall of the gate trench. The gate dielectric film 42 may be formed by oxidizing or nitriding a semiconductor on the inner wall of the gate trench. The gate conductive portion 44 is provided on an inner side of the gate dielectric film 42 inside the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided to be longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy trench, a dummy dielectric film 32, and a dummy conductive portion 34 provided on the upper surface 21 of the semiconductor substrate 10. The dummy conductive portion 34 is electrically connected to the emitter electrode 52. The dummy dielectric film 32 is provided to cover an inner wall of the dummy trench. The dummy conductive portion 34 is provided inside the dummy trench, and is provided on an inner side of the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 of the present example are covered by the interlayer dielectric film 38 on the upper surface 21 of the semiconductor substrate 10. It is to be noted that the bottom portions of the dummy trench portion 30 and the gate trench portion 40 may have a downwardly-convexed curved shape (a curved-line shape in the cross section).

Figure 4:
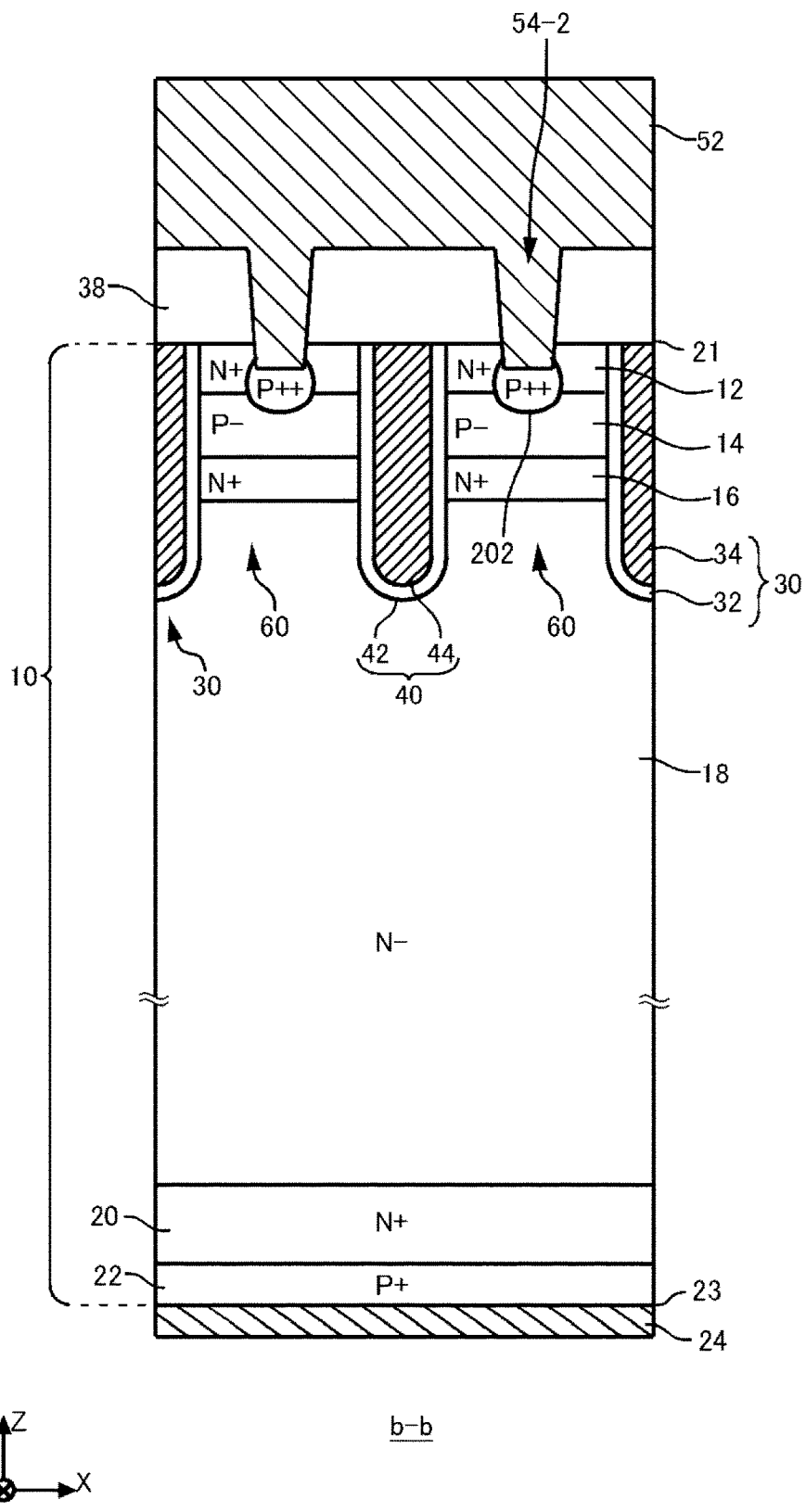
FIG. 4 is a diagram showing an example of a cross section b-b in FIG. 2.

Of the trench contact portions 54, a portion arranged above the contact region 15 is given as a first trench contact portion 54-1, and a portion arranged above the emitter region 12 is given as a second trench contact portion 54-2 (see FIG. 4). The first trench contact portion 54-1 is provided at least from the upper surface 21 of the semiconductor substrate 10 to an inside of the contact region 15. The first trench contact portion 54-1 of the present example is provided from a upper end of the interlayer dielectric film 38 to the inside of the contact region 15. A depth position of a lower end of the first trench contact portion 54-1 is arranged between a depth position of an upper end and a depth position of a lower end of the contact region 15.

In the mesa portion 60, a first plug portion 201 that is in contact with a lower end of the first trench contact portion 54-1 is provided. The first plug portion 201 is a region of the second conductivity type (the P++ type in the present example) which has a higher concentration than the base region 14. The first plug portion 201 may be a region having a higher concentration than the contact region 15. For example, when comparing at the same depth position, the doping concentration of the first plug portion 201 is higher than the doping concentration of the contact region 15. The first plug portion 201 may be formed by further implanting, after forming the contact region 15, an acceptor inside the contact region 15. The first plug portion 201 may be shallower than the contact region 15, may be at the same depth as the contact region 15, or may be deeper than the contact region 15. In the present example, the first plug portion 201 is shallower than the contact region 15.

FIG. 4 is a diagram showing an example of a cross section b-b in FIG. 2. The cross section b-b is an X-Z plane that passes through the emitter region 12 in the mesa portion 60. In the cross section, the semiconductor device 100 includes, with respect to the structure shown in FIG. 3, the second trench contact portion 54-2 in place of the first trench contact portion 54-1, the emitter region 12 in place of the contact region 15, and a second plug portion 202 in place of the first plug portion 201. Other structures may be the same as the structures shown in FIG. 3.

The second trench contact portion 54-2 is provided at least from the upper surface 21 of the semiconductor substrate 10 to an inside of the emitter region 12. The second trench contact portion 54-2 of the present example is provided from the upper end of the interlayer dielectric film 38 to the inside of the emitter region 12. A depth position of a lower end of the second trench contact portion 54-2 is arranged between a depth position of an upper end and a depth position of a lower end of the emitter region 12. Depth positions of the lower ends of the first trench contact portion 54-1 and the second trench contact portion 54-2 may be the same.

In the mesa portion 60, the second plug portion 202 that is in contact with the lower end of the second trench contact portion 54-2 is provided. The second plug portion 202 is a region of the second conductivity type (the P++ type in the present example) which has a higher concentration than the base region 14.

The second plug portion 202 may be formed by implanting, after forming the emitter region 12, an acceptor inside the emitter region 12. The first plug portion 201 and the second plug portion 202 may be regions formed by implanting the acceptors by the same dose amount at the same depth position. It is to be noted that while the first plug portion 201 is a region obtained by further implanting the acceptor into the P type contact region 15, the second plug portion 202 is a region obtained by implanting the acceptor into the N type emitter region 12 so as invert it into the P type. Thus, the second plug portion 202 may be a region having a lower net doping concentration than the first plug portion 201.

Figure 5:
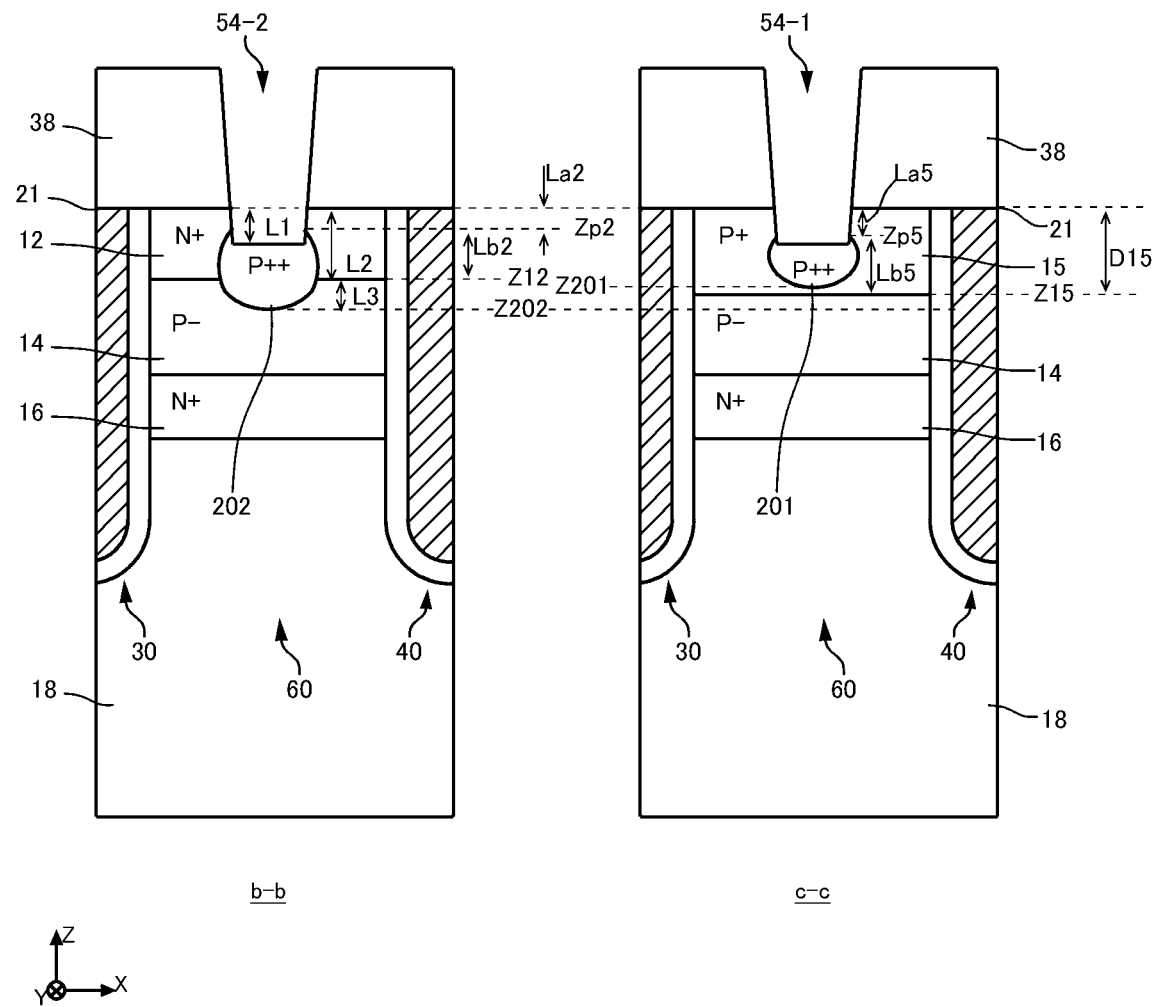
FIG. 5 is a diagram showing the cross section b-b and the cross section c-c next to each other.

FIG. 5 is a diagram showing the cross section b-b and the cross section c-c next to each other. FIG. 5 shows an enlarged diagram of the vicinity of the mesa portion 60, and the lower surface 23 (see FIGS. 3 and 4) side of the semiconductor substrate 10 is omitted. The second plug portion 202 is provided to a position closer to the lower surface 23 than the first plug portion 201. In other words, a depth position Z202 of a lower end of the second plug portion 202 is arranged closer to the lower surface 23 than a depth position Z201 of a lower end of the first plug portion 201. With this configuration, it becomes easy to extract hole carriers directed from below the emitter region 12 toward the upper surface 21, to the emitter electrode 52. In other words, since an electrical resistance of a path through which the hole carriers pass can be reduced, a voltage drop in the path can be made small, and so-called latch-up can be suppressed. The depth position Z202 of the lower end of the second plug portion 202 may be arranged 0.1 μm or more closer to the lower surface 23 than the depth position Z201 of the lower end of the first plug portion 201, or may be arranged 0.3 μm or more closer to the lower surface 23.

The depth position Z202 of the lower end of the second plug portion 202 is preferably arranged closer to the lower surface 23 than a depth position Z12 of the lower end of the emitter region 12. The depth position Z202 may be arranged inside the base region 14. With this configuration, it becomes easier to extract hole carriers directed from below the emitter region 12 toward the upper surface 21.

The contact region 15, the first plug portion 201, and the second plug portion 202 may contain acceptors of the same element. In the contact region 15, the first plug portion 201, and the second plug portion 202, elements of the acceptors having highest concentrations (atoms/cm$^3$) may be the same. The element is, for example, boron, but is not limited thereto. With the acceptors of the contact region 15 and the first plug portion 201 being of the same element, the second plug portion 202 can be formed easily to a position closer to the lower surface 23 than the first plug portion 201.

In general, as a concentration difference of an impurity increases, a diffusion coefficient of the impurity increases. In other words, when boron is implanted into a predetermined implantation region, for example, boron that is newly implanted is more apt to be diffused as the concentration of boron already existing in the vicinity of the implantation region decreases. When implanting an acceptor such as boron in order to form a plug portion, not only an acceptor for forming the base region 14 but also an acceptor for forming the contact region 15 having a higher doping concentration than the base region 14 exists in the contact region 15. That is, the acceptor such as boron is already existing at a high concentration. When implanting the acceptor at the lower end of the first trench contact portion 54-1, for example, the acceptor for forming the contact region 15 having a higher concentration than the base region 14 exists at the lower end of the first trench contact portion 54-1, and thus a concentration difference between the implanted acceptor and the acceptor already existing before the implantation is small. Therefore, a concentration gradient becomes small, and a flux when the acceptor diffuses is small so that the acceptor does not diffuse that much. On the other hand, the acceptor such as boron only exists at a level enough for forming the base region 14 in the emitter region 12. Further, the concentration of the acceptor decreases toward the lower surface 23 side at the depth position of the lower end of the second trench contact portion 54-2. With this configuration, when implanting the acceptor at the lower end of the second trench contact portion 54-2, a concentration difference between the concentration of the implanted acceptor and the concentration of the acceptor of the base region 14 is larger than that in the case of the contact region 15 (that is, the lower end of the second trench contact portion 54-2). Therefore, the concentration gradient becomes relatively large, and the flux when the acceptor diffuses becomes large. With this configuration, the implanted acceptor may diffuse deep inside the emitter region 12 mainly toward the lower surface 23 side having a low concentration, and may also further diffuse in the base region 14. Thus, when the semiconductor substrate 10 is annealed, the acceptor implanted into the emitter region 12 diffuses in a wider range toward the lower surface 23 side than the acceptor implanted into the contact region 15. Therefore, the second plug portion 202 can be provided to a position closer to the lower surface 23 than the first plug portion 201.

A depth of the trench contact portion 54 in the Z axis direction using the upper surface 21 of the semiconductor substrate 10 as a reference is represented by L1. Moreover, a width of the emitter region 12 in the Z axis direction is represented by L2. Furthermore, a length of the second plug portion 202 protruding on the lower side from the emitter region 12 in the Z axis direction is represented by L3. The depth L1 may be half or less of the width L2. By setting the depth L1 to be small, it becomes easy to fill a metal material inside the trench contact portion 54, and a failure rate of the semiconductor device can be reduced. Since the second plug portion 202 can be formed to be long on the lower surface 23 side even when the depth L1 is set to be small, latch-up can be suppressed. Moreover, by setting the depth L1 to be small, a possibility of the acceptor of the second plug portion 202 diffusing to a boundary between the gate trench portion 40 and the base region 14 can be lowered, and a variation of a threshold voltage of the transistor portion 70 can be suppressed. The depth L1 may be ¼ or less of the width L2. The depth L1 may be 0.2 μm or more and 0.6 μm or less. The depth L1 may be 0.3 μm or more, or may be 0.5 μm or less. The width L2 may be 0.3 μm or more and 0.7 μm or less. The width L2 may be 0.4 μm or more, or may be 0.6 μm or less.

The length L3 may be smaller than the width L2. The length L3 may be half or less of the width L2. If the length L3 is set too large, the possibility of the acceptor of the second plug portion 202 diffusing to the boundary between the gate trench portion 40 and the base region 14 may become high, and the threshold voltage of the transistor portion 70 may vary. The length L3 may be larger than 0 μm and 0.4 μm or less. The length L3 may be 0.1 μm or more, or may be 0.3 μm or less.

A depth position of an upper end portion of the second plug portion 202 is represented by Zp2. The upper end portion of the second plug portion 202 may be in contact with a side wall of the second trench contact portion 54-2. A width from the upper surface 21 to the depth position Zp2 of the upper end portion of the second plug portion 202 is represented by La2. A width from the depth position Zp2 to the depth position Z12 is represented by Lb2. The width La2 may be smaller than the width Lb2. With this configuration, holes can be extracted with ease while maintaining a contact resistance between the second trench contact portion 54-2 and the emitter region 12 small, and latch-up can be suppressed.

A depth position of the upper end portion of the first plug portion 201 is represented by Zp5. The upper end portion of the first plug portion 201 may be in contact with a side wall of the first trench contact portion 54-1. A width from the upper surface 21 to the depth position Zp5 of the upper end portion of the first plug portion 201 is represented by La5.

A width from the depth position Zp5 to the depth position Z15 is represented by Lb5. The width La5 may be smaller than the width Lb5. Moreover, the width La2 may be smaller than the width La5. With this configuration, holes can be extracted with ease from the second trench contact portion 54-2, and latch-up can be suppressed.

The depth position Z201 of the lower end of the first plug portion 201 may be the same depth as the depth position Z15 of the lower end of the contact region 15, or may be arranged closer to the upper surface 21 than the depth position Z15. The depth position Z15 of the lower end of the contact region 15 may be arranged closer to the lower surface 23 than the depth position Z12 of the lower end of the emitter region 12. The depth position Z202 of the lower end of the second plug portion 202 may be arranged closer to the lower surface 23 than the depth position Z15 of the lower end of the contact region 15.

The depth position Z201 of the lower end of the first plug portion 201 may be arranged closer to the lower surface 23 than the depth position Z12 of the lower end of the emitter region 12. With this configuration, it becomes easy to extract hole carriers from the lower surface 23 side, and latch-up can be suppressed. The depth position Z201 may be arranged closer to the upper surface 21 than the depth position Z12.

It is to be noted that the structure of the mesa portion 60 of the transistor portion 70 has been described with reference to FIGS. 3 to 5. The mesa portion 61 of the diode portion 80 includes, with respect to the structure of the mesa portion 60, the base region 14 in place of the emitter region 12 and the contact region 15. In addition, with respect to the structure of the mesa portion 60, the mesa portion 61 includes the cathode region 82 in place of the collector region 22. The mesa portion 61 may include the trench contact portion 54. The trench contact portion 54 is provided to the same depth position as the first trench contact portion 54-1 and the second trench contact portion 54-2. The mesa portion 61 may include a P++ type plug portion that is in contact with the lower end of the trench contact portion 54. The plug portion of the mesa portion 61 may be formed to the same depth position as the first plug portion 201, or formed to be deeper than the first plug portion 201. The plug portion of the mesa portion 61 may be formed to be shallower than the second plug portion 202. The base region 14 and the plug portion may contain acceptors of the same element.

Figure 6:
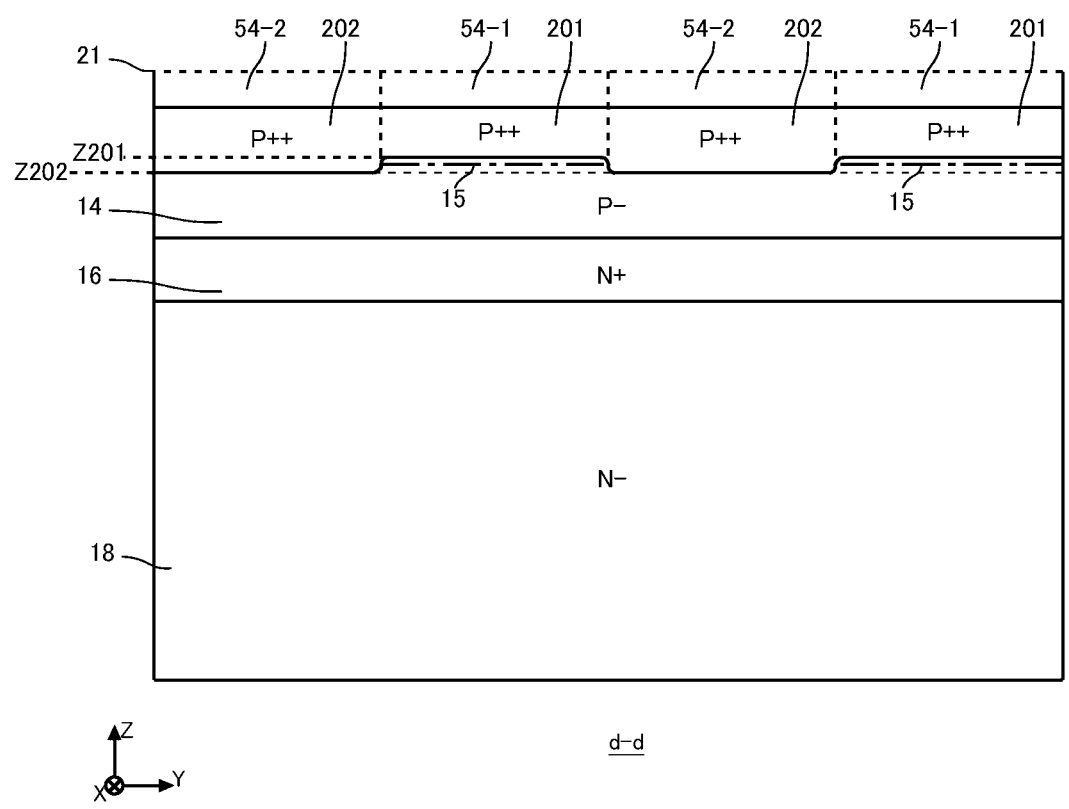
FIG. 6 is a diagram showing an example of a cross section d-d in FIG. 2.

FIG. 6 is a diagram showing an example of a cross section d-d in FIG. 2. The cross section d-d is a Y-Z plane that passes through the trench contact portion 54 in the mesa portion 60. In FIG. 6, the region on the lower surface 23 side is omitted similar to FIG. 5. Also in FIG. 6, the interlayer dielectric film 38 is omitted.

As shown in FIG. 2, the emitter region 12 and the contact region 15 are arranged alternately on the upper surface of the mesa portion 60 along the Y axis direction. Of the trench contact portions 54, a region positioned inside the contact region 15 in a top view is given as the first trench contact portion 54-1, and a region positioned inside the emitter region 12 in a top view is given as the second trench contact portion 54-2. As shown in FIG. 6, the first trench contact portion 54-1 and the second trench contact portion 54-2 are arranged alternately along the Y axis direction. The first plug portion 201 is arranged below the first trench contact portion 54-1, and the second plug portion 202 is arranged below the second trench contact portion 54-2. In other words, the first plug portion 201 and the second plug portion 202 are arranged alternately along the Y axis direction. As described above, the depth position Z202 of the lower end of the second plug portion 202 is arranged closer to the lower surface 23 than the depth position Z201 of the lower end of the first plug portion 201.

Figure 7A:
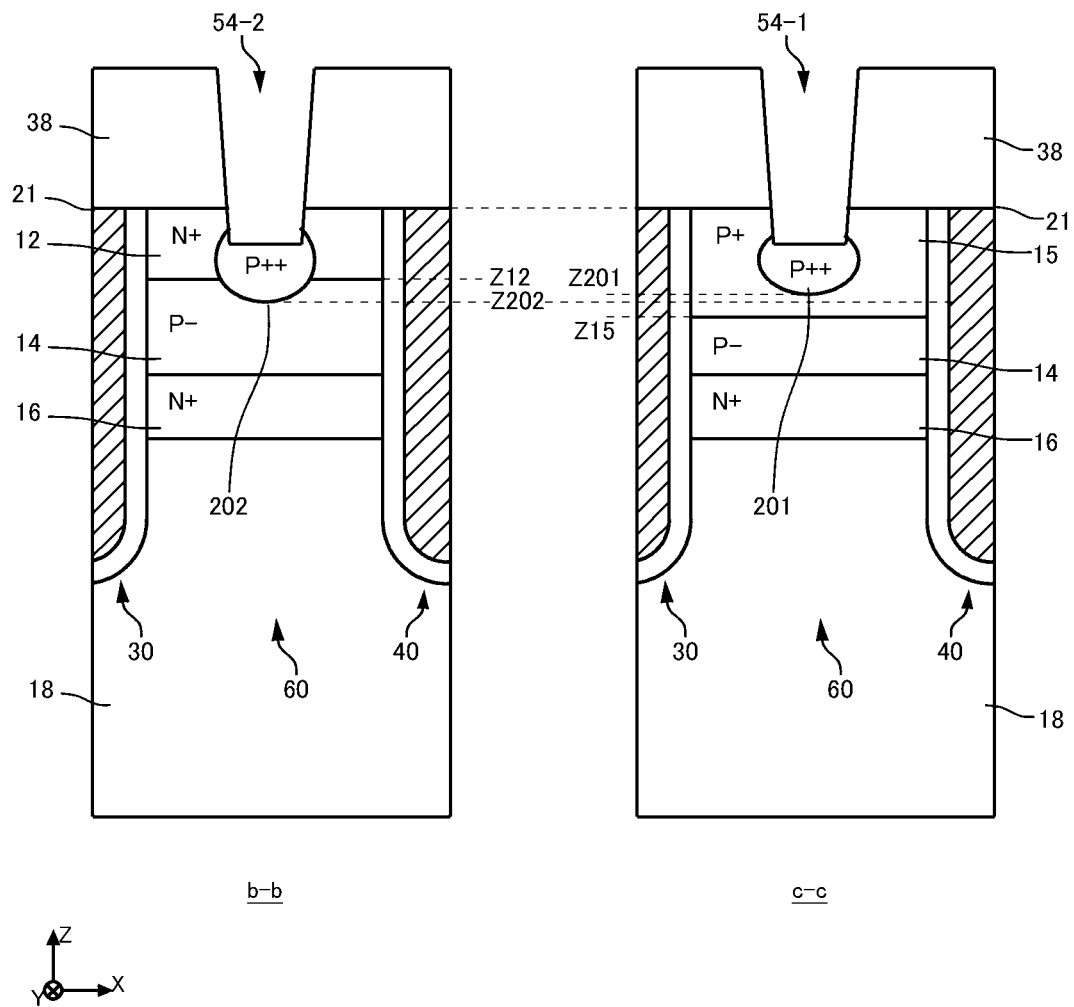
FIG. 7A is a diagram showing another example of the cross section b-b and the cross section c-c.

FIG. 7A is a diagram showing another example of the cross section b-b and the cross section c-c. In the semiconductor device 100 of the present example, relative positions of the first plug portion 201, the second plug portion 202, and the contact region 15 differ from those of the example shown in FIG. 5. Other structures are similar to those of the example shown in FIG. 5.

The depth position Z202 of the lower end of the second plug portion 202 of the present example is arranged closer to the upper surface 21 than the depth position Z15 of the lower end of the contact region 15. The depth position Z201 of the lower end of the first plug portion 201 may also be arranged closer to the upper surface 21 than the depth position Z15 of the lower end of the contact region 15. For example, by forming the trench contact portion 54 to be shallow, the depth position Z201 and the depth position Z202 can be formed to be shallower than the depth position Z15. By forming each plug portion to be shallow, it is possible to suppress diffusion of the acceptor of the plug portion to the vicinity of the gate trench portion 40, and suppress a variation of the threshold voltage of the transistor portion 70. Further, by forming the contact region 15 to be deep, it becomes easy to extract, also from the contact region 15, hole carriers directed from below the emitter region 12 toward the upper surface 21.

Figure 7B:
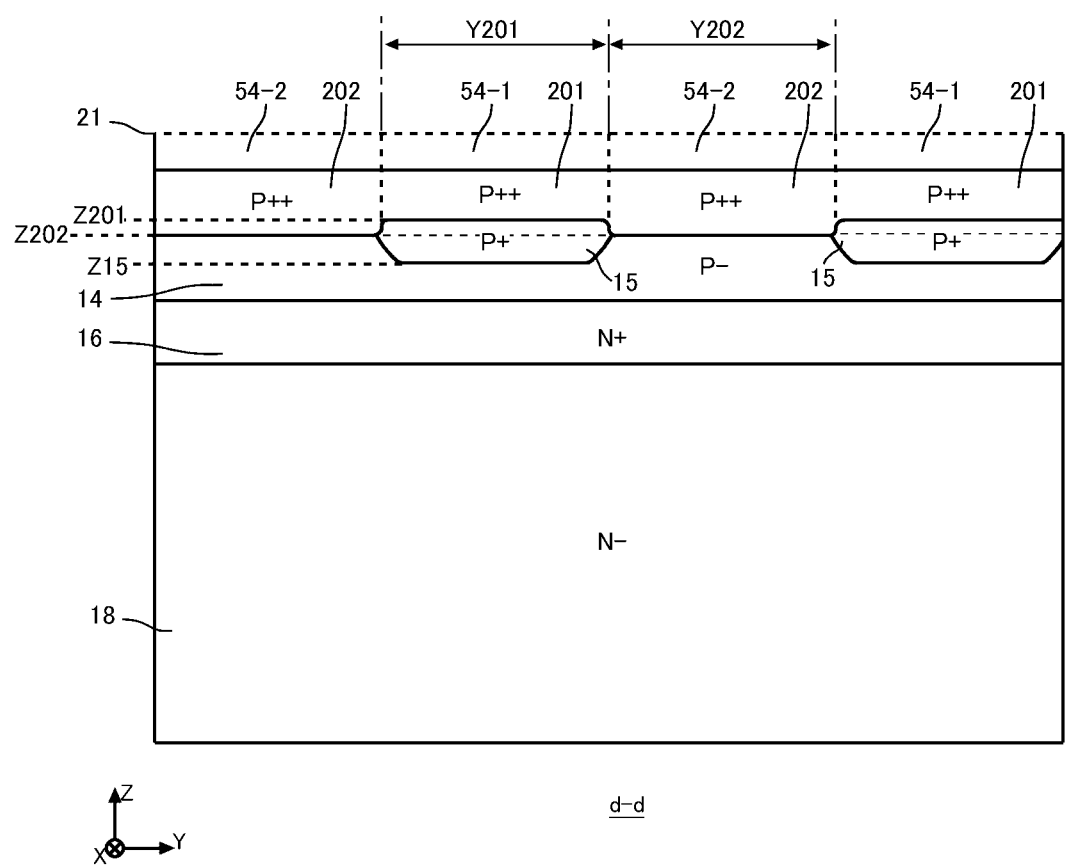
FIG. 7B is a diagram showing another example of the cross section d-d in FIG. 2.

FIG. 7B is a diagram showing another example of the cross section d-d in FIG. 2. The semiconductor device 100 of the present example has the structure shown in FIG. 7A. As described in FIG. 7A, the plug portion of the present example (that is, the first plug portion 201 and the second plug portion 202) is provided to be shallower than the contact region 15. In other words, both the depth position Z201 of the lower end of the first plug portion 201 and the depth position Z202 of the lower end of the second plug portion 202 are arranged closer to the upper surface 21 than the depth position Z15 of the lower end of the contact region 15. The second plug portion 202 may be provided closer to the lower surface 23 than the first plug portion 201. In the example shown in FIG. 7B, the depth position Z201 of the lower end of the first plug portion 201, the depth position Z202 of the lower end of the second plug portion 202, and the depth position Z15 of the lower end of the contact region 15 are arranged in the stated order of the depth position Z201, the depth position Z202, and the depth position Z15 from the upper surface 21 side.

A length of the first plug portion 201 in the Y axis direction is represented by Y201, and a length of the second plug portion 202 in the Y axis direction is represented by Y202. The length of the emitter region 12 and the length of the contact region 15 on the upper surface 21 of the semiconductor substrate 10 may be set as the length Y201 and the length Y202. The length of the emitter region 12 and the length of the contact region 15 on the upper surface 21 may be measured at positions in contact with the trench contact portion 54. As shown in FIG. 7B, when the depth positions of the first plug portion 201 and the second plug portion 202 differ, a position at which the depth positions vary in the Y axis direction may be set as a boundary position between the first plug portion 201 and the second plug portion 202.

The length Y201 of the first plug portion 201 may be longer, the same as, or shorter than the length Y202 of the second plug portion 202. The same holds true also in each of the examples disclosed in the present specification.

Figure 7C:
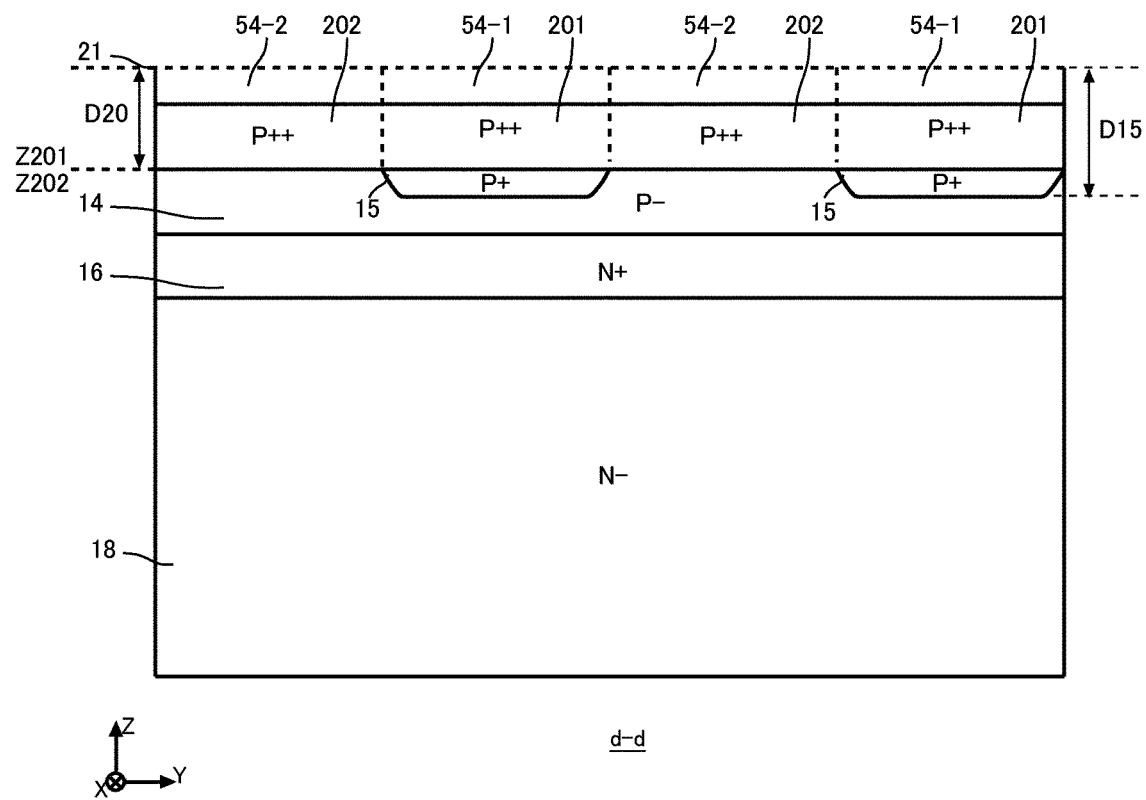
FIG. 7C is a diagram showing another example of the cross section d-d in FIG. 2.

FIG. 7C is a diagram showing another example of the cross section d-d in FIG. 2. Similar to the example shown in FIG. 7B, also in the present example, the plug portion (that is, the first plug portion 201 and the second plug portion 202) is provided to be shallower than the contact region 15. It is to be noted that in the present example, the depth position Z201 of the lower end of the first plug portion 201 and the depth position Z202 of the lower end of the second plug portion 202 are the same. Other structures are similar to those of the example shown in FIG. 7B. It is to be noted that the same depth position may include an error within +10%. In other words, when an absolute value |D201−D202| of a difference between a distance D201 from the upper surface 21 to the depth position Z201 and a distance D202 from the upper surface 21 to the depth position Z202 is 10% or less of at least one of the distance D201 or the distance D202, the depth position Z201 and the depth position Z202 may be assumed to be the same. In the present specification, the position or distance of each plug portion in the depth direction may be measured at a center of each plug portion in the Y axis direction, or an average value of values measured at a plurality of positions in the Y axis direction or a value measured by another method may be used.

The contact region 15 of the present example is formed by implanting dopant ions in the vicinity of the upper surface 21 and diffusing the dopant by heat treatment. Thus, the doping concentration of the contact region 15 decreases as a distance from the upper surface 21 in the Z axis direction increases. When the depth position Z15 of the contact region 15 is sufficiently deeper than the depth position Z201 of the first plug portion 201 and the depth position Z202 of the second plug portion 202, the doping concentration of the contact region 15 at the depth position Z201 and the depth position Z202 becomes low to approach the doping concentration of the base region 14. Thus, a diffusion depth of the dopant implanted into the contact region 15 from the lower end of the first trench contact portion 54-1 and that of the dopant implanted into the emitter region 12 or the base region 14 from the lower end of the second trench contact portion 54-2 may be of the same level. In this case, as in the present example, the depths of the first plug portion 201 and the second plug portion 202 become substantially the same.

A distance D15 from the upper surface 21 to the lower end of the contact region 15 may be 1.5 times or more, 1.75 times or more, or two times or more of a distance D20 from the upper surface 21 to the lower ends of the first plug portion 201 and the second plug portion 202. An average value of the distance from the upper surface 21 to the lower end of the first plug portion 201 and the distance from the upper surface 21 to the lower end of the second plug portion 202 may be used as the distance D20. The distance D15 from the upper surface 21 to the lower end of the contact region 15 may be measured at a center of the contact region 15 in the Y axis direction, or an average value of values measured at a plurality of positions in the Y axis direction or a value measured by another method may be used.

Figure 8:
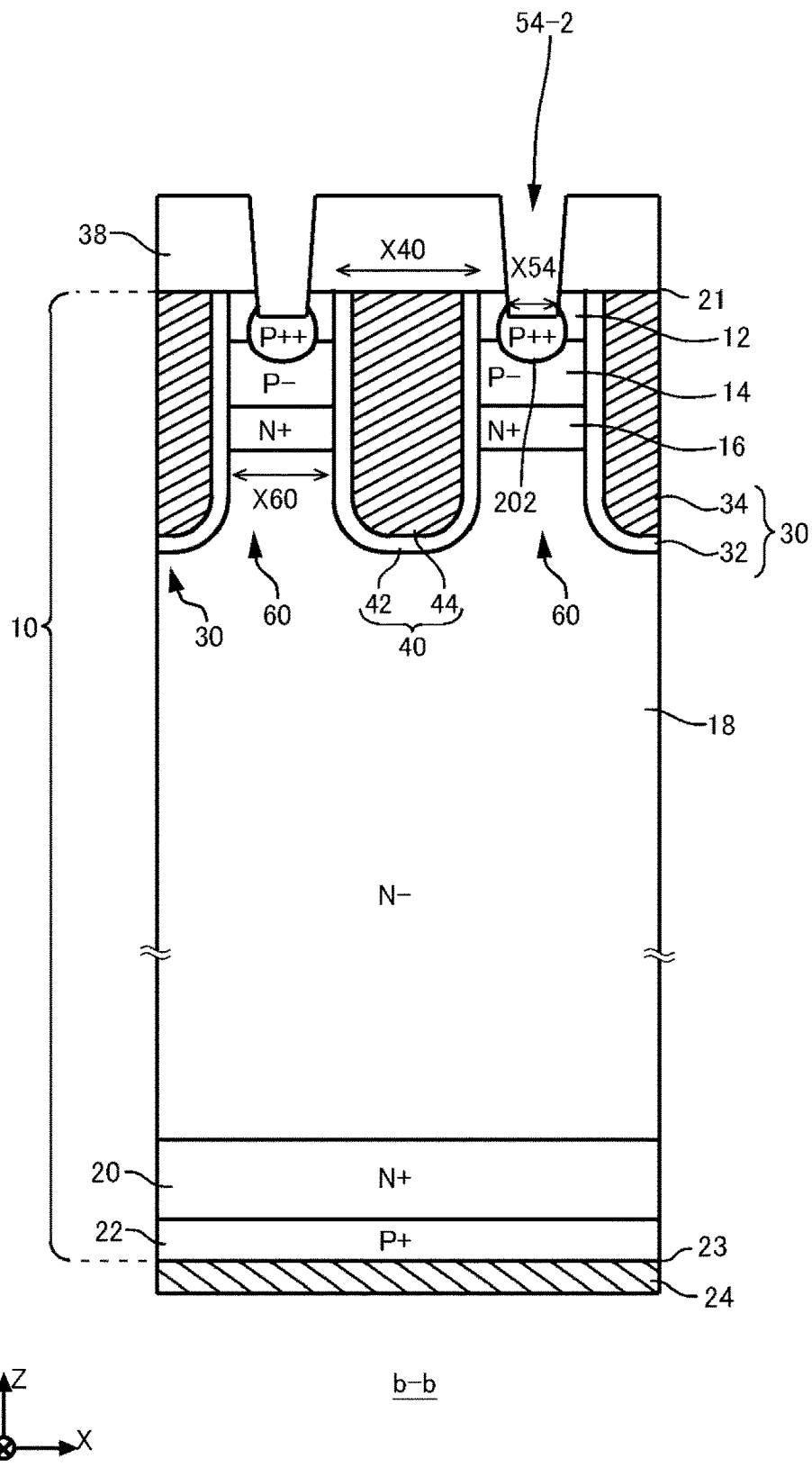
FIG. 8 is a diagram showing another example of the cross section b-b.

FIG. 8 is a diagram showing another example of the cross section b-b. A width of the mesa portion 60 in the X axis direction is represented by X60, a width of the gate trench portion 40 is represented by X40, and a width of the trench contact portion 54 is represented by X54. The width X60 and the width X40 may be the widths on the upper surface 21 of the semiconductor substrate 10. The width X54 may be a width of a bottom surface of the trench contact portion 54, or may be a width at a height of the upper surface 21 of the semiconductor substrate 10.

The width X60 of the mesa portion 60 may be smaller than the width X40 of the gate trench portion 40. By miniaturizing the mesa portion 60, the carrier injection enhancement effect (IE effect) is enhanced, and on-resistance can be reduced. Moreover, since the second plug portion 202 can be formed to be deep even if the second trench contact portion 54-2 is formed to be shallow, even when the mesa portion 60 is miniaturized, the trench contact portion 54 can be formed with ease.

The width X60 of the mesa portion 60 may be 1 μm or less, 0.8 μm or less, or 0.6 μm or less. The width X54 of the trench contact portion 54 may be half or less of the width X60 of the mesa portion 60. The width X54 may be 0.15 μm or more and 0.4 μm or less.

Figure 9:
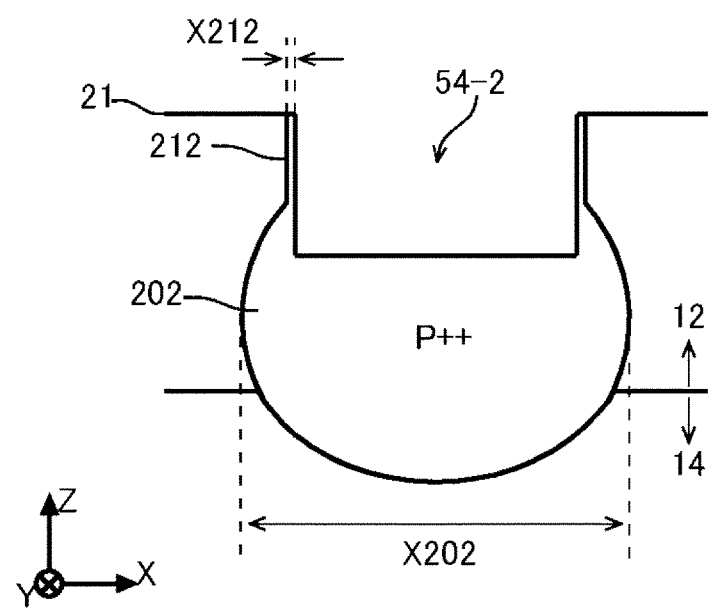
FIG. 9 is an enlarged diagram showing a vicinity of a second trench contact portion 54-2 and a second plug portion 202.

FIG. 9 is an enlarged diagram showing the vicinity of the second trench contact portion 54-2 and the second plug portion 202. The second plug portion 202 of the present example includes a second portion 212 in contact with the side surface of the second trench contact portion 54-2. The side surface of the trench contact portion 54 may refer to a surface having a tilt of 45 degrees or more and 90 degrees or less with respect to the X-Y plane. The side surface of the trench contact portion 54 may refer to a surface ranging from the upper surface 21 of the semiconductor substrate 10 to half the depth of the trench contact portion 54.

The second plug portion 202 of the present example is formed by implanting, before a metal material is filled into the second trench contact portion 54-2, the acceptor via the second trench contact portion 54-2. In this case, the acceptor is also implanted from the side surface of the second trench contact portion 54-2. When the acceptor is implanted from the side surface of the second trench contact portion 54-2 at a level enough to invert the emitter region 12 into the P type, the P type second portion 212 is formed on the side surface of the second trench contact portion 54-2. The second portion 212 may have a lower or higher doping concentration than the base region 14.

Figure 10:
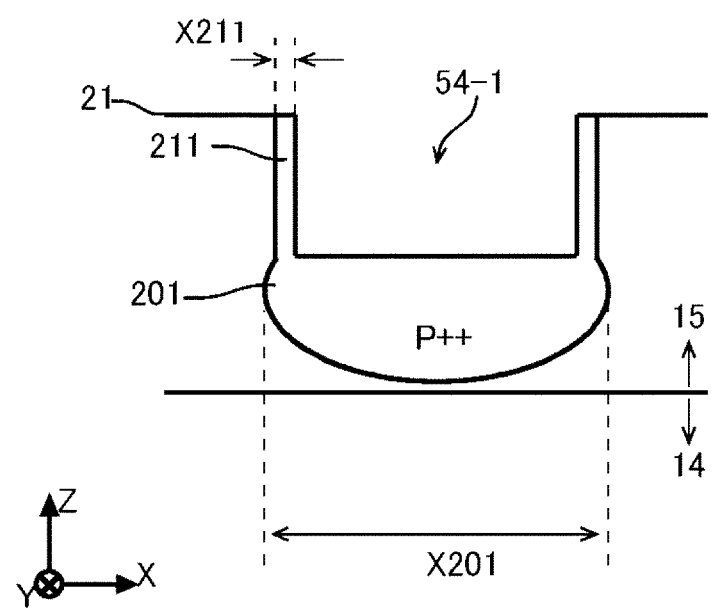
FIG. 10 is an enlarged diagram showing a vicinity of a first trench contact portion 54-1 and a first plug portion 201.

FIG. 10 is an enlarged diagram showing the vicinity of the first trench contact portion 54-1 and the first plug portion 201. Similar to the second plug portion 202 shown in FIG. 9, the first plug portion 201 of the present example includes the first portion 211 in contact with the side surface of the first trench contact portion 54-1.

A width of the first portion 211 in the X axis direction is represented by X211, and a width of the second portion 212 in the X axis direction is represented by X212. The width X211 and the width X212 may be widths on the upper surface 21 of the semiconductor substrate 10. The width X212 of the second portion 212 may be smaller than the width X211 of the first portion 211. An amount of the acceptor implanted from the side surface of each trench contact portion 54 is smaller than an amount of the acceptor implanted from the bottom surface of the trench contact portion 54. Thus, in the emitter region 12 set apart from the side surface of the second trench contact portion 54-2, an inversion into the P type is difficult even when the acceptor reaches the region. Thus, the width X212 of the second portion 212 becomes small. On the other hand, since a P type concentration of a range that the acceptor has reached increases when the acceptor is implanted from the side surface of the first trench contact portion 54-1, the width X211 of the first portion 211 may become larger than the width X212.

Further, a width of the first plug portion 201 in the X axis direction is represented by X201, and a width of the second plug portion 202 in the X axis direction is represented by X202. A maximum width of each plug portion in the X axis direction may be set as the width of each plug portion. A relatively large amount of the acceptor is implanted from the bottom surface of the trench contact portion 54. Thus, the depth position at which each plug portion shows a maximum width may be closer to the lower surface 23 than the lower end of the trench contact portion 54.

The width X201 of the first plug portion 201 may be smaller than the width X202 of the second plug portion 202. As described above, in the emitter region 12, the acceptor is more apt to be diffused than in the contact region 15. Thus, a large amount of the acceptor implanted from the bottom surface of the second trench contact portion 54-2 may diffuse widely also in the X axis direction in the emitter region 12, and thus the width X202 may become larger than the width X201.

Figure 11:
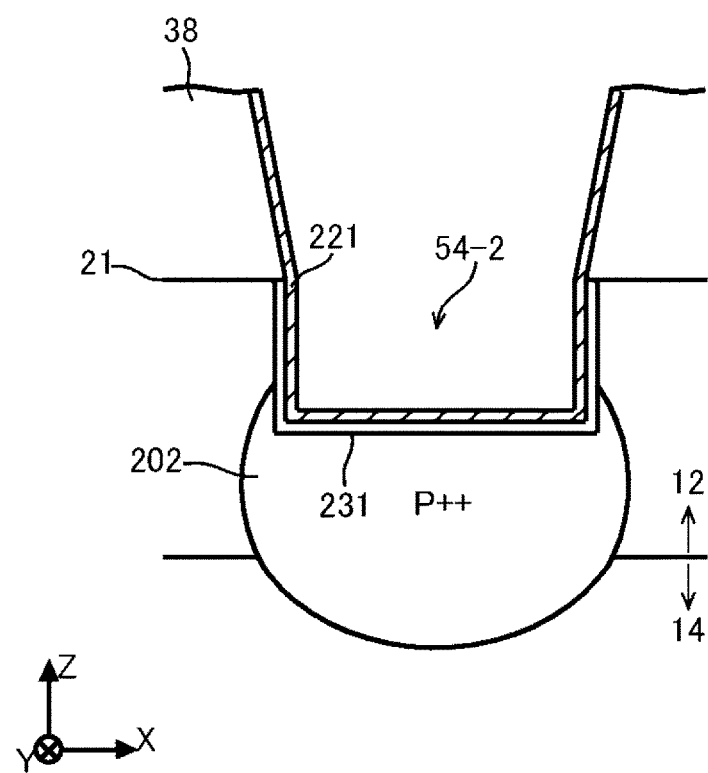
FIG. 11 is a diagram showing another example of the vicinity of the second trench contact portion 54-2 and the second plug portion 202.

FIG. 11 is a diagram showing another example of the vicinity of the second trench contact portion 54-2 and the second plug portion 202. The semiconductor device 100 of the present example includes a barrier metal 221 and a silicide portion 231. Other structures are similar to those of the semiconductor device 100 according to any of the aspects described with reference to FIGS. 1 to 11.

The barrier metal 221 is provided along the bottom surface and side surface of the trench contact portion 54. The barrier metal 221 is arranged between the semiconductor substrate 10 and an electrode including aluminum, tungsten, or the like. The barrier metal 221 may further be provided along a side surface of the interlayer dielectric film 38, and may further be provided along an upper surface of the interlayer dielectric film 38. The barrier metal 221 may be formed of metal including titanium. The barrier metal 221 may be a stacked film obtained by stacking a titanium nitride film and a titanium film.

The silicide portion 231 is provided at a boundary between the second trench contact portion 54-2 and the semiconductor substrate 10. The silicide portion 231 of the present example is provided at a boundary between the barrier metal 221 and the semiconductor substrate 10. The silicide portion 231 may be a portion formed by turning metal contained in the barrier metal 221 into silicide by silicon contained in the semiconductor substrate 10. The silicide portion 231 of the present example is titanium silicide.

The second plug portion 202 of the present example contains boron. The silicide portion 231 may also contain boron. Boron of the second plug portion 202 may be diffused inside the silicide portion 231. A portion of the silicide portion 231 in contact with the second plug portion 202 may contain boron. Although FIG. 11 shows the second trench contact portion 54-2 and the second plug portion 202, the barrier metal 221 and the silicide portion 231 may also be provided in the vicinity of the first trench contact portion 54-1 and the first plug portion 201. An entire boundary of the silicide portion 231 of the first trench contact portion 54-1 on the semiconductor substrate 10 side is in contact with the contact region 15 or the first plug portion 201. The entire boundary of the silicide portion 231 of the first trench contact portion 54-1 may contain boron.

Figure 12A:
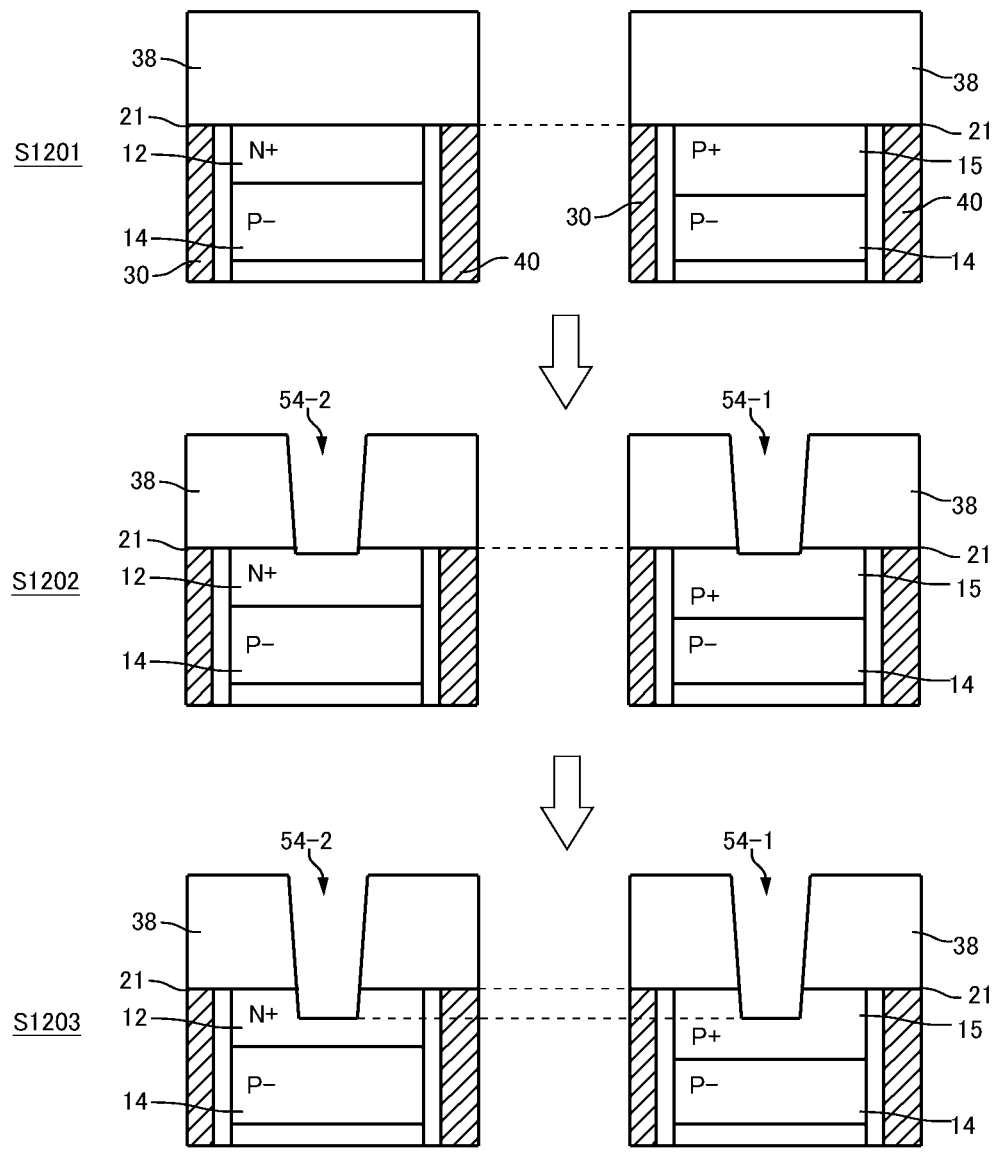
FIG. 12A is a diagram showing an example of a manufacturing method of the semiconductor device 100.
Figure 12B:
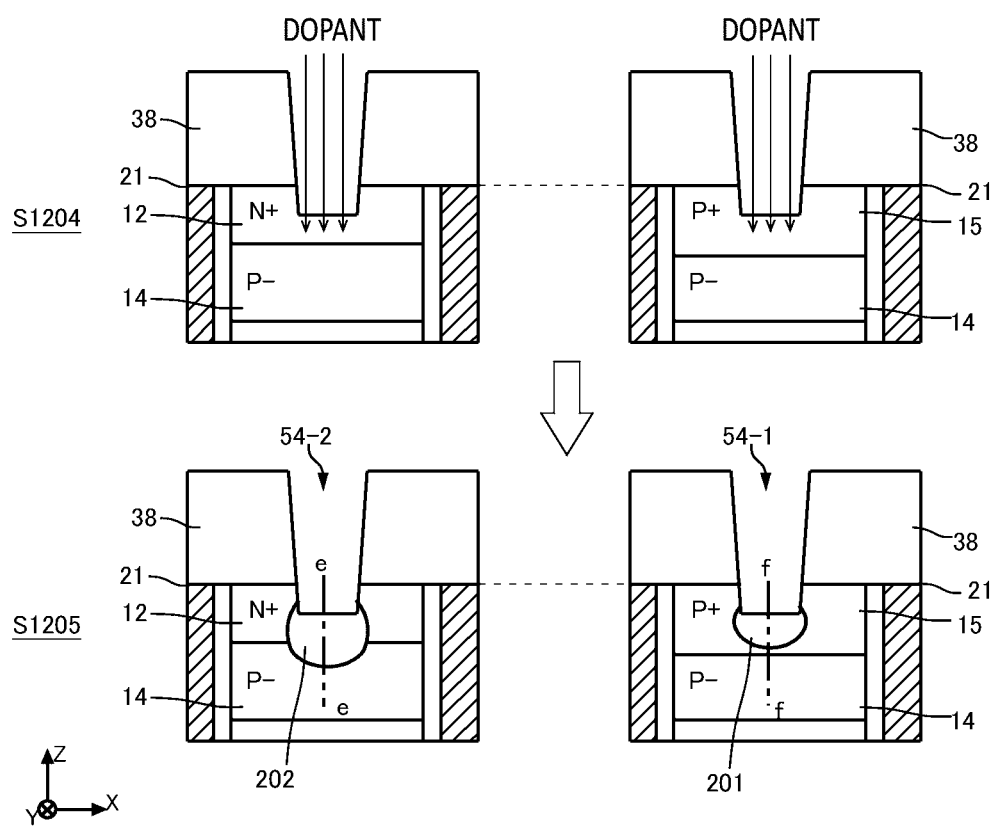
FIG. 12B is a diagram showing an example of the manufacturing method of the semiconductor device 100.

FIGS. 12A and 12B are each a diagram showing an example of a manufacturing method of the semiconductor device 100. FIGS. 12A and 12B show some of manufacturing processes. Similar to FIG. 5, FIGS. 12A and 12B each show the cross section that passes through the emitter region 12 and the cross section that passes through the contact region 15 next to each other. FIGS. 12A and 12B each show the structure of the mesa portion 60 on the upper surface 21 side.

First, in an upper surface side structure formation step S1201, a structure in the vicinity of the upper surface 21 of the semiconductor substrate 10 is formed. In the upper surface side structure formation step S1201, the base region 14, the emitter region 12, the contact region 15, the gate trench portion 40, the dummy trench portion 30, and the interlayer dielectric film 38 are formed in the semiconductor substrate 10 including the drift region 18. The accumulation region 16 may additionally be formed in the upper surface side structure formation step S1201.

Next, in trench formation steps S1202 and S1203, the interlayer dielectric film 38 and the upper surface 21 of the semiconductor substrate 10 are etched to thus form the first trench contact portion 54-1 and the second trench contact portion 54-2. The first trench contact portion 54-1 is provided to the inside of the contact region 15, and the second trench contact portion 54-2 is provided to the inside of the emitter region 12. It is to be noted that in these steps, a metal material is not filled inside the first trench contact portion 54-1 and the second trench contact portion 54-2. In the present example, a groove formed in the interlayer dielectric film 38 and the semiconductor substrate 10 is referred to as the trench contact portion 54.

Next, in a plug implantation step S1204, a dopant of the second conductivity type is implanted into the semiconductor substrate 10 via each trench contact portion 54. The dopant preferably is of the same element as the dopant implanted for forming the contact region 15. The dopant of the present example is boron. In the plug implantation step S1204, an acceleration energy of the dopant ions is set such that a concentration peak of the implanted dopant is arranged inside the emitter region 12 and the contact region 15. The dopant ions of the same dose amount (ions/cm$^2$) may be implanted with respect to the first trench contact portion 54-1 and the second trench contact portion 54-2.

Next, in a plug annealing step S1205, the semiconductor substrate 10 is annealed. Accordingly, the first plug portion 201 and the second plug portion 202 are formed. As described above, in the emitter region 12, a diffusion coefficient of the acceptor is larger than that in the contact region 15. Thus, the second plug portion 202 is formed in a wider range than the first plug portion 201. In the plug annealing step S1205, the entire semiconductor substrate 10 may be annealed in an annealing furnace. In the plug annealing step S1205, the semiconductor substrate 10 may be annealed under a condition of a temperature and time with which the second plug portion 202 reaches at least the base region 14.

After the plug annealing step S1205, the metal material may be filled inside the trench contact portion 54. In addition, the emitter electrode 52 may be formed after the plug annealing step S1205. Moreover, after the plug annealing step S1205, the buffer region 20, the collector region 22, the cathode region 82, and the collector electrode 24 on the lower surface 23 side of the semiconductor substrate 10 may be formed.

Figure 13:
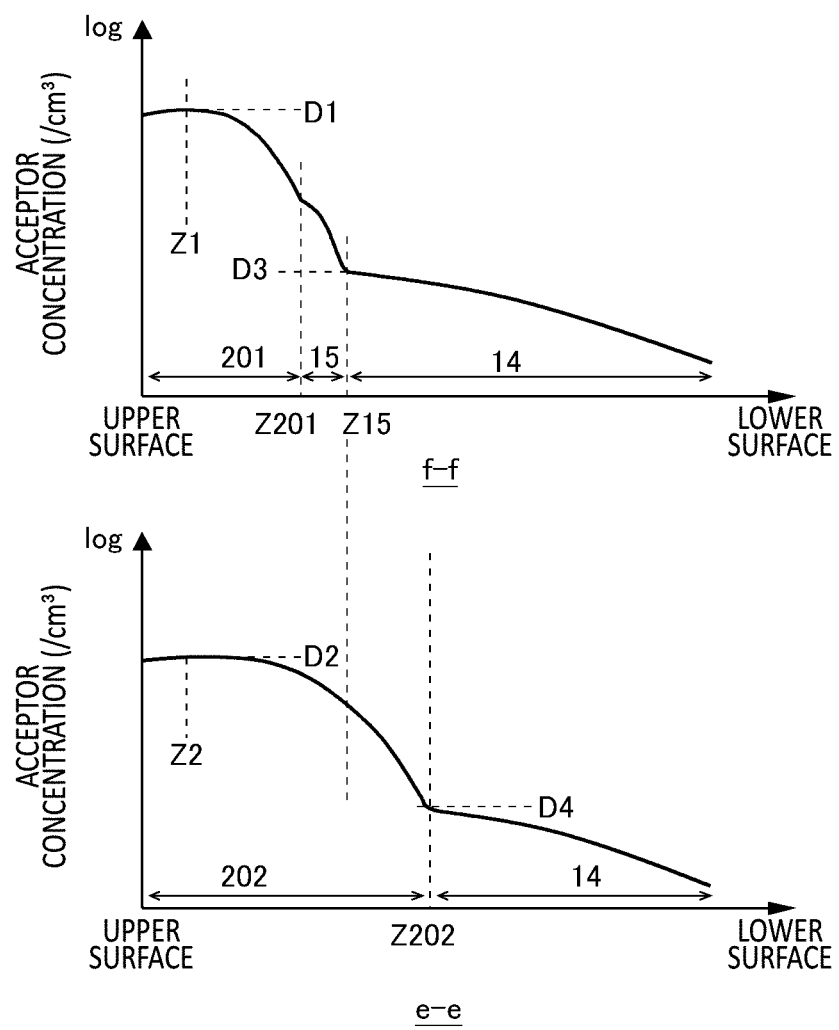
FIG. 13 is a diagram showing an example of an acceptor concentration distribution on a line e-e and a line f-f in FIG. 12B.

FIG. 13 is a diagram showing an example of an acceptor concentration distribution on a line e-e and a line f-f in FIG. 12B. The line e-e is a line parallel to the Z axis, that passes through a part of the second plug portion 202 and the base region 14. The line f-f is a line parallel to the Z axis, that passes through a part of the first plug portion 201 and the base region 14.

As described with reference to FIGS. 12A and 12B, the dose amounts of the acceptor such as boron with respect to the first plug portion 201 and the second plug portion 202 are the same. It is to be noted that in the second plug portion 202, the acceptor diffuses in a wider range than in the first plug portion 201. Thus, a peak value D2 of the acceptor concentration of the second plug portion 202 may be smaller than a peak value D1 of the acceptor concentration of the first plug portion 201. A depth position Z1 at which the acceptor concentration shows a peak value in the first plug portion 201 and a depth position Z2 at which the acceptor concentration shows a peak value in the second plug portion 202 may be the same or may differ. Moreover, in at least one of the first plug portion 201 or the second plug portion 202, an acceptor concentration at a position in contact with the lower end of the trench contact portion 54 may show a maximum value.

As described above, the depth position Z202 of the lower end of the second plug portion 202 is arranged closer to the lower surface 23 than the depth position Z201 of the lower end of the first plug portion 201. The depth position Z202 and the depth position Z201 may each be a position of a change point at which an absolute value of a gradient of the acceptor concentration first shows a decrease from the lower end of the trench contact portion 54 toward the lower surface 23 side. As described above, since the acceptor implanted into the second plug portion 202 is widely diffused on the lower surface 23 side, the position that shows a local minimum value is arranged closer to the lower surface 23 than the first plug portion 201.

The peak value D1 of the acceptor concentration of the first plug portion 201 may be $1\times10^{20}/cm^3$ or more. The peak value D1 may be $1\times10^{21}/cm^3$ or less. It is to be noted that the peak value of the acceptor concentration in the contact region 15 may be smaller than the peak value D1. The peak value of the acceptor concentration in the contact region 15 may be $1\times10^{19}/cm^3$ or more and smaller than $1\times10^{20}/cm^3$. The peak value D2 of the acceptor concentration of the second plug portion 202 may be higher than the peak value of the acceptor concentration in the contact region 15. An acceptor concentration D3 of the base region 14 at the depth position Z201 and an acceptor concentration D4 of the base region 14 at the depth position Z202 are, for example, $1\times10^{16}/cm^3$ or more and $5\times10^{17}/cm^3$ or less. The acceptor concentration D4 may be lower than the acceptor concentration D3.

According to the present example, the peak value D2 of the second plug portion 202 is smaller than the peak value D1 of the first plug portion 201. As described above, before the acceptor is implanted via the trench contact portion 54, the acceptor concentration ($/cm^3$) at the lower end of the second trench contact portion 54-2 is lower than the acceptor concentration at the lower end of the first trench contact portion 54-1 at least by about one digit. Therefore, the implanted acceptor is mainly diffused toward the lower surface 23 side inside the emitter region 12. Thus, the peak value D2 becomes smaller than the peak value D1. Moreover, inside the emitter region 12, the diffusion of the acceptor in a direction horizontal to the upper surface 21 can be made relatively small, and a variation of the threshold voltage of the transistor portion 70 can be suppressed. Furthermore, by setting the peak value D2 of the second plug portion 202 high, extraction of hole carriers becomes easy.

Figure 14:
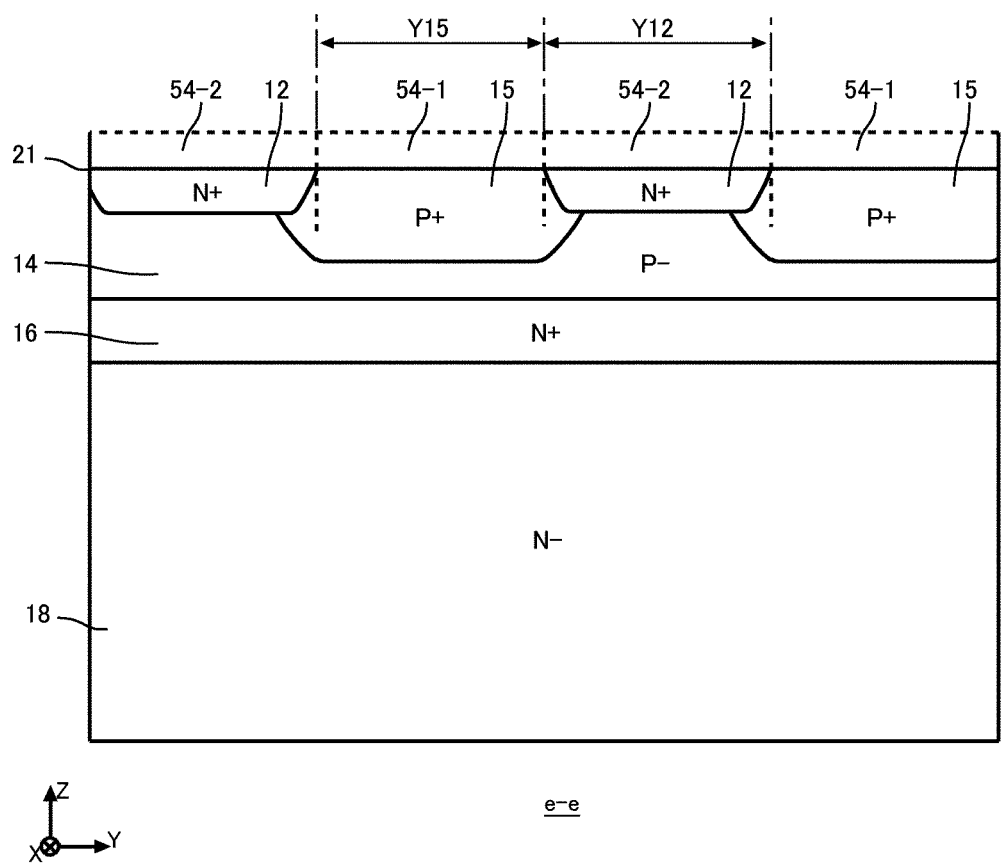
FIG. 14 is a diagram showing an example of a cross section e-e in FIG. 2.

FIG. 14 is a diagram showing an example of the cross section e-e in FIG. 2. Structures other than the cross section e-e are similar to any of the forms described with reference to FIGS. 1 to 13. The cross section e-e is a Y-Z plane that passes through the vicinity of the gate trench portion 40 in the mesa portion 60. In the cross section e-e, the first plug portion 201 and the second plug portion 202 are not formed. In the X axis direction, a distance between the cross section e-e and the gate trench portion 40 may be 1/10 or less of a distance between the gate trench portion 40 and the trench contact portion 54. In FIG. 14, the region on the lower surface 23 side is omitted similar to FIG. 5. Also in FIG. 14, the interlayer dielectric film 38 is omitted.

In the cross section, the emitter region 12 and the contact region 15 are provided alternately along the Y axis direction on the upper surface 21 of the semiconductor substrate 10. The contact region 15 may be formed to a position deeper than that of the emitter region 12.

In the Y axis direction, a length of the emitter region 12 is represented by Y12, and a length of the contact region 15 is represented by Y15. The length of each region may be measured using a boundary position of the emitter region 12 and the contact region 15 on the upper surface 21. The length Y12 of the emitter region 12 may be shorter than, the same as, or longer than the length Y15 of the contact region 15.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the present invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device, comprising:
   a semiconductor substrate including an upper surface, a lower surface, and a drift region of a first conductivity type;
   a base region of a second conductivity type, which is provided between the upper surface and the drift region;
   a gate trench portion which is provided from the upper surface to the drift region and is provided so as to extend in a longitudinal direction in the upper surface;
   an emitter region of a first conductivity type, which is provided between the upper surface and the base region and is in contact with the gate trench portion;
   a contact region of a second conductivity type, which is provided between the upper surface and the base region and is arranged alternately with the emitter region in a longitudinal direction of the gate trench portion;
   a first trench contact portion provided from the upper surface to an inside of the contact region;
   a second trench contact portion provided from the upper surface to an inside of the emitter region;
   a first plug portion of a second conductivity type, which is provided in contact with a lower end of the first trench contact portion and has a higher concentration than the base region; and a second plug portion of a second conductivity type, which is provided in contact with a lower end of the second trench contact portion, is provided to a position closer to the lower surface than the first plug portion, and has a higher concentration than the base region.

2. The semiconductor device according to claim 1, wherein
the contact region, the first plug portion, and the second plug portion contain acceptors of a same element.

3. The semiconductor device according to claim 1, wherein
a lower end of the second plug portion is arranged closer to the lower surface than a lower end of the emitter region.

4. The semiconductor device according to claim 3, wherein
the lower end of the second plug portion is arranged closer to the upper surface than a lower end of the contact region.

5. The semiconductor device according to claim 1, wherein
a lower end of the first plug portion is arranged at a same depth position as a lower end of the contact region or is arranged closer to the upper surface than the lower end of the contact region.

6. The semiconductor device according to claim 1, wherein
a depth position of a lower end of the second plug portion is arranged 0.1 μm or more closer to the lower surface than a depth position of a lower end of the first plug portion.

7. The semiconductor device according to claim 6, wherein
the depth position of the lower end of the second plug portion is arranged 0.3 μm or more closer to the lower surface than the depth position of the lower end of the first plug portion.

8. The semiconductor device according to claim 1, wherein
a peak value of an acceptor concentration of the second plug portion is smaller than a peak value of an acceptor concentration of the first plug portion.

9. The semiconductor device according to claim 1, further comprising:
a trench portion which is provided adjacent to the gate trench portion in an array direction perpendicular to the longitudinal direction, is provided from the upper surface to the drift region, and is provided so as to extend in the longitudinal direction; and
a mesa portion sandwiched between the gate trench portion and the trench portion,
wherein a width of the mesa portion in the array direction is smaller than a width of the gate trench portion.

10. The semiconductor device according to claim 1, wherein
the first plug portion includes a first portion in contact with a side surface of the first trench contact portion,
the second plug portion includes a second portion in contact with a side surface of the second trench contact portion, and
a width of the second portion is smaller than a width of the first portion.

11. The semiconductor device according to claim 1, wherein
the first plug portion and the second plug portion contain boron,
the semiconductor substrate contains silicon, a silicide portion is provided at a boundary between: the first trench contact portion and the second trench contact portion; and the semiconductor substrate, and
the silicide portion contains boron.

12. A semiconductor device, comprising:
a semiconductor substrate including an upper surface, a lower surface, and a drift region of a first conductivity type;
a base region of a second conductivity type, which is provided between the upper surface and the drift region;
a gate trench portion which is provided from the upper surface to the drift region and is provided so as to extend in a longitudinal direction in the upper surface;
an emitter region of a first conductivity type, which is provided between the upper surface and the base region and is in contact with the gate trench portion;
a contact region of a second conductivity type, which is provided between the upper surface and the base region and is arranged alternately with the emitter region in a longitudinal direction of the gate trench portion;
a trench contact portion which is provided from the upper surface to an inside of the contact region and also from the upper surface to an inside of the emitter region; and
a plug portion of a second conductivity type, which is, in both the emitter region and the contact region, provided in contact with a lower end of the trench contact portion, has a higher concentration than the base region, and is provided to be shallower than the contact region.

13. The semiconductor device according to claim 12, wherein
the trench contact portion includes:
a first trench contact portion provided from the upper surface to the inside of the contact region; and
a second trench contact portion provided from the upper surface to the inside of the emitter region, and
the plug portion includes:
a first plug portion provided in contact with a lower end of the first trench contact portion; and
a second plug portion which is provided in contact with a lower end of the second trench contact portion and is provided to a same depth as the first plug portion.

14. The semiconductor device according to claim 13, wherein
both the first plug portion and the second plug portion are provided to be shallower than the contact region.

15. The semiconductor device according to claim 14, wherein
a distance from the upper surface of the semiconductor substrate to a lower end of the contact region is 1.5 times or more of a distance from the upper surface of the semiconductor substrate to lower ends of the first plug portion and the second plug portion.

16. The semiconductor device according to claim 12, wherein
the trench contact portion includes:
a first trench contact portion provided from the upper surface to the inside of the contact region; and
a second trench contact portion provided from the upper surface to the inside of the emitter region, and
the plug portion includes:
a first plug portion provided in contact with a lower end of the first trench contact portion; and
a second plug portion which is provided in contact with a lower end of the second trench contact portion and is provided to a position closer to the lower surface than the first plug portion.

17. A manufacturing method, comprising:
forming an upper surface side structure by forming, in a semiconductor substrate including an upper surface, a lower surface, and a drift region of a first conductivity type, a base region of a second conductivity type, which is provided between the upper surface and the drift region, a gate trench portion which is provided from the upper surface to the drift region and is provided so as to extend in a longitudinal direction in the upper surface, an emitter region of a first conductivity type, which is provided between the upper surface and the base region and is in contact with the gate trench portion, and a contact region of a second conductivity type, which is provided between the upper surface and the base region and is arranged alternately with the emitter region in a longitudinal direction of the gate trench portion;
forming a trench by forming a first trench contact portion provided from the upper surface to an inside of the contact region and a second trench contact portion provided from the upper surface to an inside of the emitter region;
implanting a plug by implanting a dopant of a second conductivity type into the semiconductor substrate via the first trench contact portion and the second trench contact portion; and
annealing a plug by annealing the semiconductor substrate to form a first plug portion of a second conductivity type, which is provided in contact with a lower end of the first trench contact portion, and a second plug portion of a second conductivity type, which is provided in contact with a lower end of the second trench contact portion and is provided to a position closer to the lower surface than the first plug portion.

18. The semiconductor device according to claim 2, wherein
a lower end of the first plug portion is arranged at a same depth position as a lower end of the contact region or is arranged closer to the upper surface than the lower end of the contact region.

19. The semiconductor device according to claim 3, wherein
a lower end of the first plug portion is arranged at a same depth position as a lower end of the contact region or is arranged closer to the upper surface than the lower end of the contact region.

20. The semiconductor device according to claim 4, wherein
a lower end of the first plug portion is arranged at a same depth position as the lower end of the contact region or is arranged closer to the upper surface than the lower end of the contact region.

* * * * *